(12) United States Patent
Baek et al.

(10) Patent No.: US 10,637,507 B2
(45) Date of Patent: *Apr. 28, 2020

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG Electronics Inc., Seoul (KR)

(72) Inventors: Jongseob Baek, Seoul (KR); Byounggill Kim, Seoul (KR); Woochan Kim, Seoul (KR); Jaehyung Kim, Seoul (KR); Sungryong Hong, Seoul (KR); Chulkyu Mun, Seoul (KR); Jinyong Choi, Seoul (KR); Jaeho Hwang, Seoul (KR); Kookyeon Kwak, Seoul (KR); Woosuk Ko, Seoul (KR)

(73) Assignee: LG ELECTROICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/382,073

(22) Filed: Apr. 11, 2019

(65) Prior Publication Data

US 2019/0238160 A1   Aug. 1, 2019

Related U.S. Application Data

(63) Continuation of application No. 15/402,838, filed on Jan. 10, 2017, now Pat. No. 10,298,270, which is a
(Continued)

(51) Int. Cl.
*H04L 27/26* (2006.01)
*H03M 13/27* (2006.01)
(Continued)

(52) U.S. Cl.
CPC ... *H03M 13/2792* (2013.01); *H03M 13/1102* (2013.01); *H04L 1/0041* (2013.01);
(Continued)

(58) Field of Classification Search
CPC ... H04L 1/0071; H04L 5/0023; H04L 5/0053; H04L 27/2626; H04L 5/0048; H04L 65/4076
(Continued)

(56) References Cited

U.S. PATENT DOCUMENTS

| | | | |
|---|---|---|---|
| 6,985,434 B2 | 1/2006 | Wu et al. | 370/208 |
| 7,139,964 B2 | 11/2006 | Shen et al. | 714/758 |

(Continued)

FOREIGN PATENT DOCUMENTS

| | | |
|---|---|---|
| CN | 101300801 A | 11/2008 |
| CN | 101483629 A | 7/2009 |

(Continued)

OTHER PUBLICATIONS

U.S. Appl. No. 15/402,838, filed Jan. 10, 2017.
U.S. Appl. No. 14/970,171, filed Dec. 15, 2015.
U.S. Appl. No. 14/307,004, filed Jun. 17, 2014.

*Primary Examiner* — Emmanuel Bayard
(74) *Attorney, Agent, or Firm* — Dentons US LLP

(57) ABSTRACT

A method and an apparatus for transmitting broadcast signals thereof are disclosed. The method for transmitting broadcast signals includes encoding DP data according to a code rate, wherein the encoding further includes LDPC encoding the DP data according to the code rate, bit interleaving the LDPC encoded DP data, mapping the bit interleaved DP data onto constellations, MIMO (Multi Input Multi Output) encoding the mapped DP data, and time interleaving the MIMO encoded DP data; building at least one signal frame by arranging the encoded DP data; and
(Continued)

modulating data in the built signal frame by OFDM method and transmitting the broadcast signals having the modulated data, wherein the step of modulating includes inserting CPs in the built signal frame based on a CP set which includes information about locations of CPs, wherein the CP set is defined based on FFT size.

8 Claims, 27 Drawing Sheets

Related U.S. Application Data continuation of application No. 14/970,171, filed on Dec. 15, 2015, now Pat. No. 9,577,859, which is a continuation of application No. 14/307,004, filed on Jun. 17, 2014, now Pat. No. 9,246,730.

(60) Provisional application No. 61/837,131, filed on Jun. 19, 2013, provisional application No. 61/847,534, filed on Jul. 17, 2013.

(51) Int. Cl.
    *H04L 1/00*    (2006.01)
    *H04L 5/00*    (2006.01)
    *H03M 13/11*    (2006.01)

(52) U.S. Cl.
    CPC .......... *H04L 1/0042* (2013.01); *H04L 1/0045* (2013.01); *H04L 1/0048* (2013.01); *H04L 1/0058* (2013.01); *H04L 1/0071* (2013.01); *H04L 1/0083* (2013.01); *H04L 5/0048* (2013.01); *H04L 27/2613* (2013.01); *H04L 27/2627* (2013.01); *H04L 1/0057* (2013.01); *H04L 5/0007* (2013.01); *H04L 5/0023* (2013.01); *H04L 2001/0093* (2013.01)

(58) Field of Classification Search
    USPC .................. 375/260, 262, 295, 341
    See application file for complete search history.

(56) References Cited

U.S. PATENT DOCUMENTS

| | | | |
|---|---|---|---|
| 7,218,683 B2 | 5/2007 | Ko et al. .................. 375/299 |
| 7,599,430 B1 | 10/2009 | Andrews .................. 375/226 |
| 7,636,929 B2 | 12/2009 | Park .......................... 725/54 |
| 7,692,727 B2 | 4/2010 | Yoon ........................ 348/732 |
| 7,773,682 B2 | 8/2010 | Hayashi et al. ........... 375/260 |
| 7,813,262 B1 | 10/2010 | Rao ........................... 370/208 |
| 7,848,468 B2 | 12/2010 | Guey ................ H04L 5/0007 375/346 |
| 7,852,241 B2 | 12/2010 | Matsubayashi ............. 341/81 |
| 7,859,987 B2 | 12/2010 | Ouyang et al. ............ 370/208 |
| 7,873,113 B2* | 1/2011 | Takano .............. H04B 7/0417 375/267 |
| 7,881,390 B2 | 2/2011 | Sadowsky et al. ........ 375/260 |
| 8,077,766 B2 | 12/2011 | Boher et al. ............... 375/232 |
| 8,111,763 B2 | 2/2012 | Ma .................... H04B 7/0678 375/260 |
| 8,111,782 B2* | 2/2012 | Kim .................... H04B 7/063 375/316 |
| 8,170,090 B2 | 5/2012 | Taylor et al. .............. 375/230 |
| 8,194,806 B2 | 6/2012 | Okazaki et al. ........... 375/345 |
| 8,248,910 B2 | 8/2012 | Jokela et al. .............. 370/208 |
| 8,295,375 B2 | 10/2012 | Stadelmeier et al. ...... 375/260 |
| 8,326,235 B2* | 12/2012 | Sato .................... H04B 1/48 327/308 |
| 8,462,866 B2 | 6/2013 | Stadelmeier et al. ...... 375/260 |
| 8,503,583 B2 | 8/2013 | Yokokawa et al. ........ 375/340 |
| 8,542,776 B2* | 9/2013 | Kim ..................... H04B 7/063 375/316 |
| 8,605,802 B2 | 12/2013 | Lee et al. .................. 375/260 |
| 8,799,739 B2 | 8/2014 | Yokokawa et al. .......... 714/758 |
| 8,897,698 B2 | 11/2014 | Jeon et al. .................. 455/15 |
| 8,908,784 B2 | 12/2014 | Nammi et al. ............. 375/260 |
| 9,246,730 B2 | 1/2016 | Baek et al. |
| 9,444,582 B2 | 9/2016 | Stadelmeier et al. |
| 10,298,270 B2* | 5/2019 | Baek ................... H04L 1/0042 |
| 2005/0147186 A1 | 7/2005 | Funamoto et al. ........... 375/324 |
| 2007/0008876 A1 | 1/2007 | Welnick et al. |
| 2007/0177688 A1 | 8/2007 | Wu et al. ..................... 375/267 |
| 2007/0189151 A1 | 8/2007 | Pan et al. ..................... 370/210 |
| 2009/0110092 A1 | 4/2009 | Taylor et al. ................. 375/260 |
| 2009/0110093 A1 | 4/2009 | Taylor et al. ................. 375/260 |
| 2009/0110094 A1 | 4/2009 | Taylor et al. ................. 375/260 |
| 2009/0110095 A1 | 4/2009 | Taylor et al. ................. 375/260 |
| 2009/0110097 A1 | 4/2009 | Taylor et al. ................. 375/260 |
| 2009/0110098 A1 | 4/2009 | Taylor et al. ................. 375/260 |
| 2009/0125780 A1 | 5/2009 | Taylor et al. ................. 714/752 |
| 2009/0190567 A1 | 7/2009 | Lim et al. ..................... 370/345 |
| 2009/0213946 A1 | 8/2009 | Dick et al. .................... 375/260 |
| 2009/0296838 A1 | 12/2009 | Atungsiri et al. ............. 375/260 |
| 2009/0296840 A1 | 12/2009 | Atungsiri et al. ............. 375/260 |
| 2010/0290415 A1 | 11/2010 | Han et al. ..................... 370/329 |
| 2010/0296593 A1 | 11/2010 | Atungsiri et al. ............. 375/260 |
| 2011/0255640 A1 | 10/2011 | Bao et al. ..................... 375/340 |
| 2011/0280327 A1 | 11/2011 | Ko et al. ...................... 375/260 |
| 2012/0020423 A1 | 1/2012 | Reuven et al. ............... 375/260 |
| 2012/0050547 A1 | 3/2012 | Gaddam |
| 2012/0218991 A1 | 8/2012 | Mueller |
| 2012/0269284 A1 | 10/2012 | Jen et al. ....................... 375/295 |
| 2012/0272117 A1 | 10/2012 | Stadelmeier et al. ........ 714/752 |
| 2012/0320889 A1 | 12/2012 | Zhang |
| 2012/0324315 A1 | 12/2012 | Zhang et al. |
| 2012/0327879 A1 | 12/2012 | Stadelmeier et al. ........ 370/329 |
| 2013/0012140 A1 | 1/2013 | Besoli et al. .................. 455/73 |
| 2013/0012144 A1 | 1/2013 | Besoli et al. .................. 455/85 |
| 2013/0039303 A1 | 2/2013 | Stadelmeier et al. |
| 2013/0064314 A1 | 3/2013 | Ko et al. |
| 2013/0163518 A1 | 6/2013 | Dateki ........................... 370/328 |
| 2013/0170535 A1 | 7/2013 | Atungsiri et al. ............. 375/229 |
| 2013/0202001 A1 | 8/2013 | Zhang ........................... 370/476 |
| 2013/0216001 A1 | 8/2013 | Petrov .......................... 375/298 |
| 2013/0227378 A1 | 8/2013 | Yamamoto et al. ........... 714/776 |
| 2013/0246883 A1 | 9/2013 | Shinya et al. ................ 714/752 |
| 2013/0254617 A1 | 9/2013 | Shinohara et al. ........... 714/752 |
| 2013/0294532 A1 | 11/2013 | Inagawa et al. .............. 375/257 |
| 2013/0316665 A1 | 11/2013 | Kim et al. ..................... 455/101 |
| 2014/0255029 A1 | 9/2014 | Varanese et al. ............. 398/66 |
| 2014/0314177 A1 | 10/2014 | Choi et al. ................... 375/296 |
| 2015/0055502 A1* | 2/2015 | Seo ..................... H04W 72/044 370/252 |

FOREIGN PATENT DOCUMENTS

| | | |
|---|---|---|
| CN | 101601243 A | 12/2009 |
| CN | 101998286 A | 3/2011 |
| CN | 102100067 A | 6/2011 |
| CN | 102217266 A | 10/2011 |
| CN | 102265519 A | 11/2011 |
| CN | 102282844 A | 12/2011 |
| CN | 102292983 A | 12/2011 |
| CN | 102301705 A | 12/2011 |
| CN | 102308577 A | 1/2012 |
| EP | 2071757 A1 | 6/2009 |
| EP | 2536133 A2 | 12/2012 |
| JP | 2012-165398 A | 8/2012 |
| JP | 2013-048434 A | 3/2013 |
| JP | 2014523152 A | 9/2014 |
| JP | 6346274 B2 | 6/2018 |
| KR | 1020080104658 A | 12/2008 |
| WO | 2011/001632 A1 | 1/2011 |
| WO | 2011/096768 A2 | 8/2011 |
| WO | 2011127295 A1 | 10/2011 |
| WO | 2014204181 A1 | 12/2014 |

* cited by examiner

FIG. 20

| | | | scattered pattern-1 | | | scattered pattern-2 | ... | scattered pattern-N |
|---|---|---|---|---|---|---|---|---|

PN1 (8K mode):
| 15 | 1981 | 81 | 3223 |
| 99 | 2845 | 129 | 5635 |
| 3435 | 4321 | 969 | 2468 |
| 3519 | 1490 | 5385 | 4604 |
| 3591 | 2006 | 5877 | 1390 |
| 3915 | 4994 | 5961 | 3370 |
| 2262 | 4852 | 948 | 3418 |
| 3462 | 6052 | 1644 | 3323 |
| 3726 | 149 | 1800 | 5159 |
| 4302 | 1013 | 1824 | 6239 |
| 5178 | 2645 | 6264 | xxxx |
| 5730 | 559 | | |

→ This additional positions are used when multiplexing is accomplished

PN2 (16K mode):
| 37 | 3444 | 153 | 5369 |
| 3459 | 5172 | 561 | 979 |
| 3483 | 1081 | 1509 | 3931 |
| 3543 | 3337 | 2877 | 5755 |
| 3615 | 3565 | 4341 | 5396 |
| 5187 | 230 | 5013 | 5900 |
| 78 | 2342 | 1032 | 1654 |
| 126 | 3410 | 3252 | 1834 |
| 954 | 2224 | 3396 | 5974 |
| 2286 | 4288 | 2015 | 1811 |
| 3738 | 101 | 2039 | xxxx |
| 6270 | 4313 | | |

Uncorrelated CP position

PN3 (32K mode):
| 15 | 4278 | 6768 | 463 |
| 75 | 5610 | 97 | 2287 |
| 147 | 873 | 4405 | 4303 |
| 1719 | 1545 | 6661 | 1928 |
| 6783 | 3477 | 3554 | 2432 |
| 6807 | 3885 | 5666 | 2506 |
| 270 | 4833 | 6734 | 4978 |
| 2802 | 6201 | 820 | 5158 |
| 3402 | 1704 | 5548 | 5135 |
| 3450 | 4356 | 845 | 5339 |
| 6720 | 6576 | 5363 | xxxx |
| 3425 | 1901 | | |

PN4:
| 15 | 6810 | 5148 | 4361 |
| 75 | 1941 | 5172 | 5993 |
| 147 | 2433 | 877 | 2191 |
| 471 | 2517 | 5329 | 3907 |
| 3447 | 3429 | 6193 | 6571 |
| 6783 | 3477 | 1550 | 1160 |
| 282 | 4317 | 4838 | 5816 |
| 858 | 2820 | 5354 | 4738 |
| 1734 | 4296 | 1408 | 6718 |
| 2286 | 4992 | 2608 | 6766 |
| 5610 | 2795 | 3497 | |
| 6671 | 1715 | | |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application is a continuation of U.S. patent application Ser. No. 15/402,838, filed Jan. 10, 2017, which is a continuation of U.S. patent application Ser. No. 14/970,171, filed Dec. 15, 2015, now U.S. Pat. No. 9,577,859, which is a continuation of U.S. patent application Ser. No. 14/307,004, filed Jun. 17, 2014, now U.S. Pat. No. 9,246,730, which claims the benefit of U.S. Provisional Application Nos. 61/837,131, filed Jun. 19, 2013 and 61/847,534, filed Jul. 17, 2013, the entire contents of which is hereby incorporated by reference in its entirety.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention devised to solve the problem lies on an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention devised to solve the problem lies on an apparatus for transmitting broadcast signals, an apparatus for receiving broadcast signals and methods for transmitting and receiving broadcast signals to classify data corresponding to services by components, transmit data corresponding to each component as a data pipe, receive and process the data Another object of the present invention devised to solve the problem lies on an apparatus for transmitting broadcast signals, an apparatus for receiving broadcast signals and methods for transmitting and receiving broadcast signals to signal signaling information necessary to provide broadcast signals.

The object of the present invention can be achieved by providing a method of transmitting broadcast signals including encoding DP (Data Pipe) data according to a code rate, wherein the encoding further includes LDPC (Low Density Parity Check) encoding the DP data according to the code rate, bit interleaving the LDPC encoded DP data, mapping the bit interleaved DP data onto constellations, MIMO (Multi Input Multi Output) encoding the mapped DP data, and time interleaving the MIMO encoded DP data; building at least one signal frame by arranging the encoded DP data; and modulating data in the built signal frame by OFDM (Orthogonal Frequency Division Multiplexing) method and transmitting the broadcast signals having the modulated data, wherein the step of modulating includes inserting CPs (Continual Pilots) in the built signal frame based on a CP set which includes information about locations of CPs, wherein the CP set is defined based on FFT (Fast Fourier Transform) size.

Preferably, the CP set includes a common CP set and an additional CP set.

Preferably, the information about locations of CPs in the common CP set defined based on 32K FFT size includes the information about locations of CPs in the common CP set defined based on 16K FFT size.

Preferably, the common CP set includes information about locations of non SP (Scattered Pilot) bearing CPs, and wherein the additional CP set includes information about locations of SP bearing CPs.

Preferably, the common CP set defined based on 32K FFT size includes a first sub-set, a second sub-set, a third sub-set and a fourth sub-set, wherein the third sub-set is generated by inverting the first sub-set and shifting the inverted first sub-set, wherein the fourth sub-set is generated by inverting the second sub-set and shifting the the inverted second sub-set.

In another aspect of the present invention, provided herein is an method of receiving broadcast signals including receiving the broadcast signals having at least one signal frame and demodulating data in the at least one signal frame by OFDM (Orthogonal Frequency Division Multiplexing) method; parsing the at least one signal frame by demapping DP (Data Pipe) data; and decoding the DP data, wherein the decoding further includes time deinterleaving the DP data, MIMO (Multi Input Multi Output) decoding the time deinterleaved DP data, demapping the MIMO decoded DP data from constellations, bit deinterleaving the demapped DP data, and LDPC (Low Density Parity Check) decoding the bit deinterleaved DP data, wherein the step of demodulating includes obtaining CPs (Continual Pilots) in the at least one signal frame, wherein the CPs are located based on a CP set which includes information about locations of CPs, wherein the CP set is defined based on FFT (Fast Fourier Transform) size.

Preferably, the CP set includes a common CP set and an additional CP set.

Preferably, the information about locations of CPs in the common CP set defined based on 32K FFT size includes the information about locations of CPs in the common CP set defined based on 16K FFT size.

Preferably, the common CP set includes information about locations of non SP (Scattered Pilot) bearing CPs, and wherein the additional CP set includes information about locations of SP bearing CPs.

Preferably, the common CP set defined based on 32K FFT size includes a first sub-set, a second sub-set, a third sub-set and a fourth sub-set, wherein the third sub-set is generated by inverting the first sub-set and shifting the inverted first sub-set, wherein the fourth sub-set is generated by inverting the second sub-set and shifting the the inverted second sub-set.

In another aspect of the present invention, provided herein is an apparatus for transmitting broadcast signals including an encoding module configured to encode DP (Data Pipe) data according to a code rate, wherein the encoding module further includes a LDPC (Low Density Parity Check) encoding module configured to LDPC encode the DP data according to the code rate, a bit interleaving module configured to bit interleave the LDPC encoded DP data, a mapping module configured to map the bit interleaved DP data onto constellations, a MIMO (Multi Input Multi Output) encoding module configured to MIMO encode the mapped DP data, and a time interleaving module configured to time interleave the MIMO encoded DP data; a frame building module configured to build at least one signal frame by arranging the encoded DP data; and an OFDM (Orthogonal Frequency Division Multiplexing) module configured to modulate data in the built signal frame by OFDM method and transmit the broadcast signals having the modulated data, wherein the OFDM module further configured to insert CPs (Continual Pilots) in the built signal frame based on a CP set which includes information about locations of CPs, wherein the CP set is defined based on FFT (Fast Fourier Transform) size.

Preferably, the CP set includes a common CP set and an additional CP set.

Preferably, the information about locations of CPs in the common CP set defined based on 32K FFT size includes the information about locations of CPs in the common CP set defined based on 16K FFT size.

Preferably, the common CP set includes information about locations of non SP (Scattered Pilot) bearing CPs, and wherein the additional CP set includes information about locations of SP bearing CPs.

Preferably, the common CP set defined based on 32K FFT size includes a first sub-set, a second sub-set, a third sub-set and a fourth sub-set, wherein the third sub-set is generated by inverting the first sub-set and shifting the inverted first sub-set, wherein the fourth sub-set is generated by inverting the second sub-set and shifting the the inverted second sub-set.

In another aspect of the present invention, provided herein is an apparatus for receiving broadcast signals including an OFDM (Orthogonal Frequency Division Multiplexing) module configured to receive the broadcast signals having at least one signal frame and demodulate data in the at least one signal frame by OFDM method; a parsing module configured to parse the at least one signal frame by demapping DP (Data Pipe) data; and a decoding module configured to decode the DP data, wherein the decoding module further includes a time deinterleaving module configured to time deinterleave the DP data, a MIMO (Multi Input Multi Output) decoding module configured to MIMO decode the time deinterleaved DP data, a demapping module configured to demap the MIMO decoded DP data from constellations, a bit deinterleaving module configured to bit deinterleave the demapped DP data, and a LDPC (Low Density Parity Check) decoding module configured to LDPC decode the bit deinterleaved DP data, wherein the OFDM module further configured to obtain CPs (Continual Pilots) in the at least one signal frame, wherein the CPs are located based on a CP set which includes information about locations of CPs, wherein the CP set is defined based on FFT (Fast Fourier Transform) size.

Preferably, the CP set includes a common CP set and an additional CP set.

Preferably, the information about locations of CPs in the common CP set defined based on 32K FFT size includes the information about locations of CPs in the common CP set defined based on 16K FFT size.

Preferably, the common CP set includes information about locations of non SP (Scattered Pilot) bearing CPs, and wherein the additional CP set includes information about locations of SP bearing CPs.

Preferably, the common CP set defined based on 32K FFT size includes a first sub-set, a second sub-set, a third sub-set and a fourth sub-set, wherein the third sub-set is generated by inverting the first sub-set and shifting the inverted first sub-set, wherein the fourth sub-set is generated by inverting the second sub-set and shifting the the inverted second sub-set.

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention, illustrate embodiments of the invention and together with the description serve to explain the principle of the invention.

In the drawings:

FIG. 20 illustrates a method for generating a reference index table in CP pattern generation method #1 using the position multiplexing method according to an embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
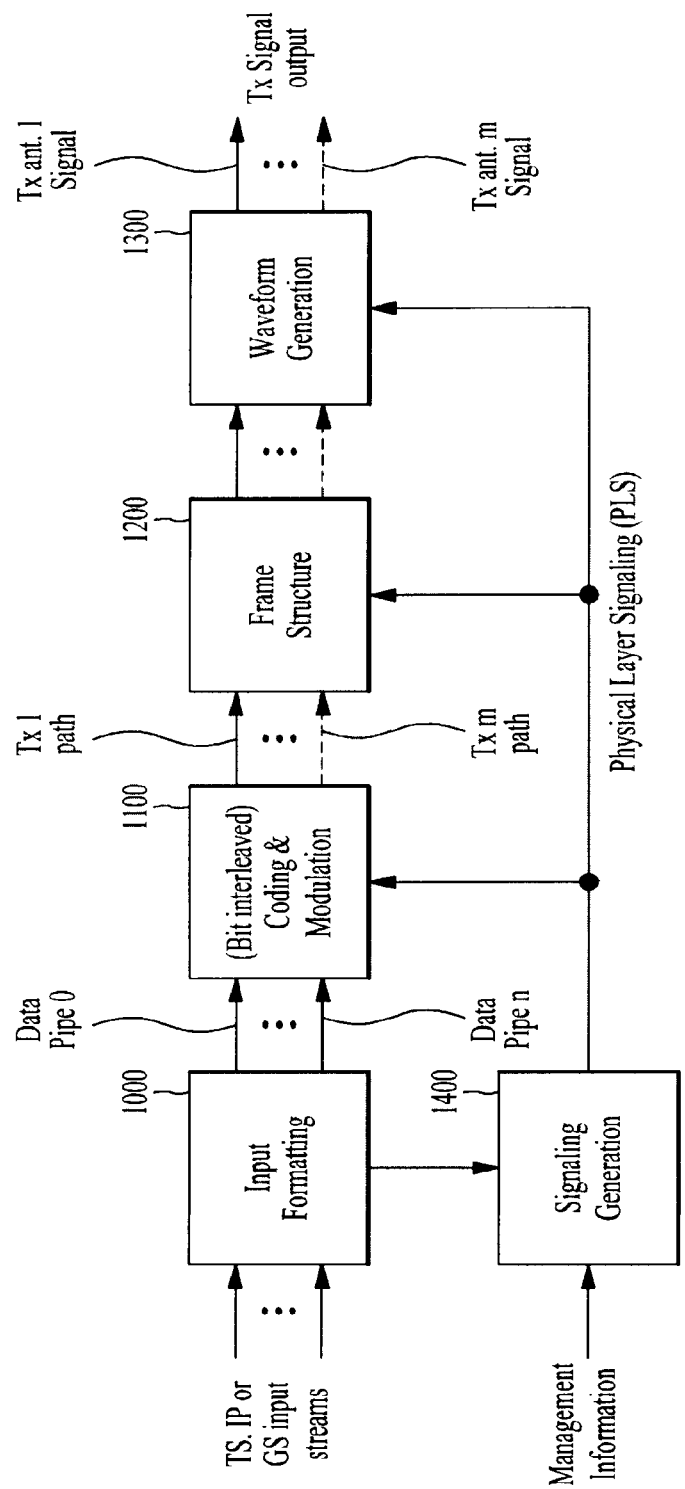
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
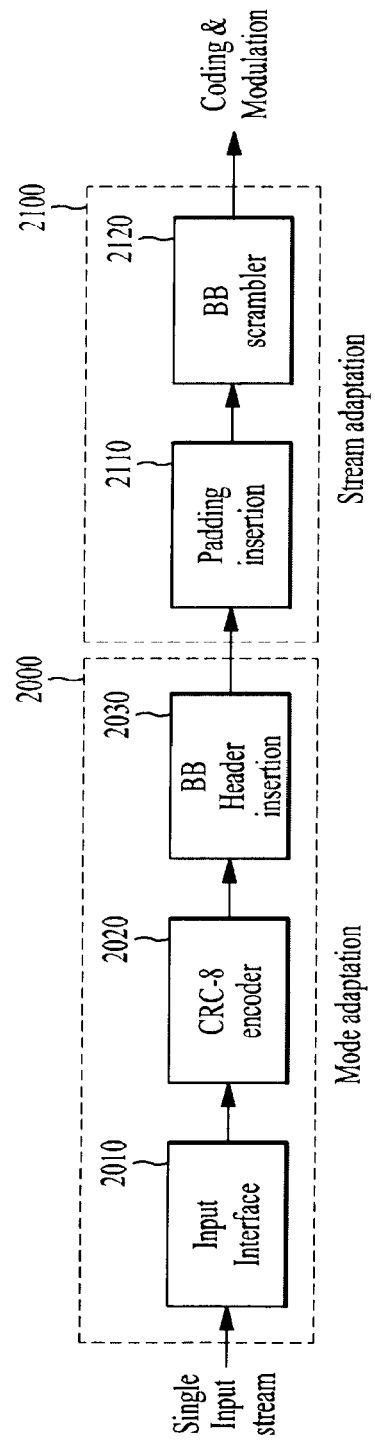
FIG. 2 illustrates an input formatting module according to an embodiment of the present invention.
Figure 3:
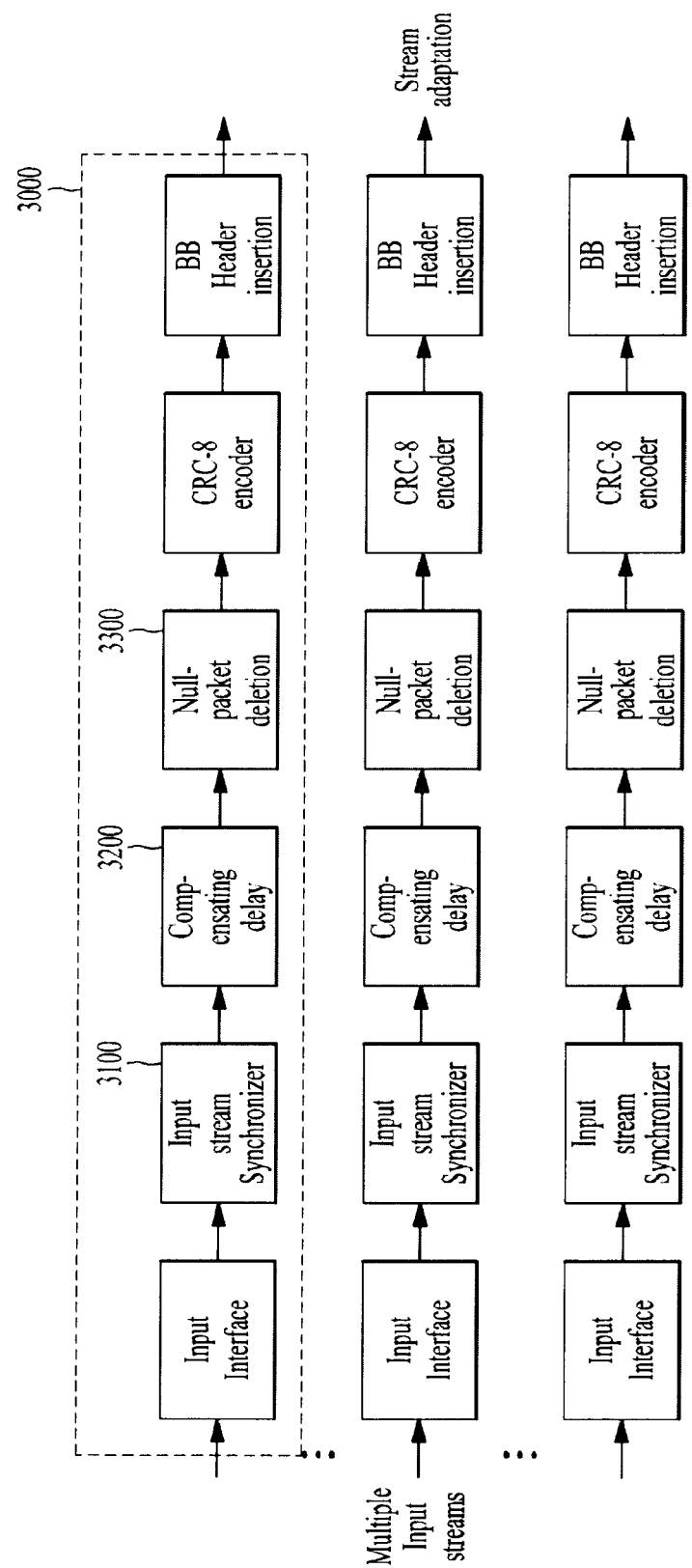
FIG. 3 illustrates an input formatting module according to another embodiment of the present invention.
Figure 4:
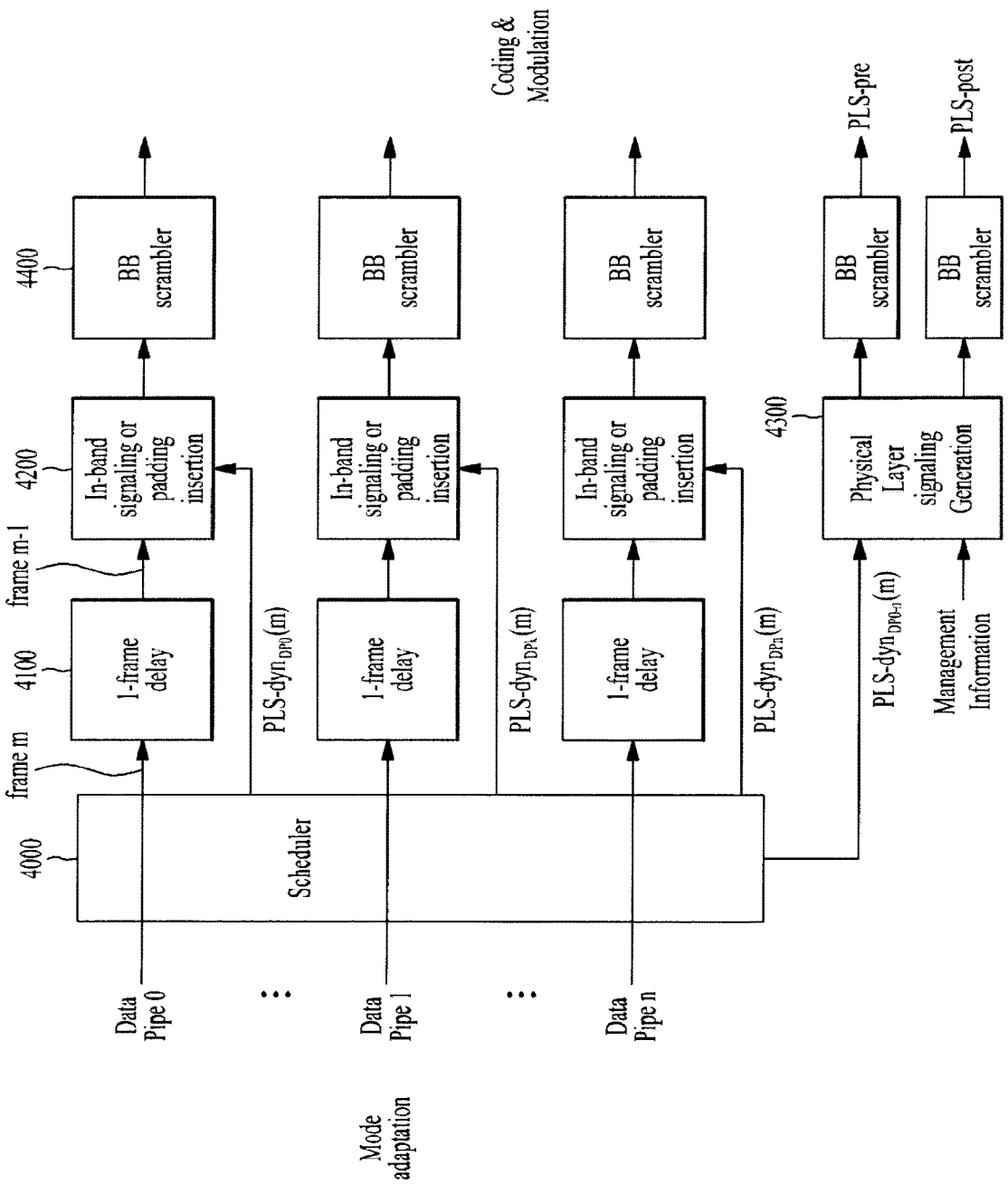
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
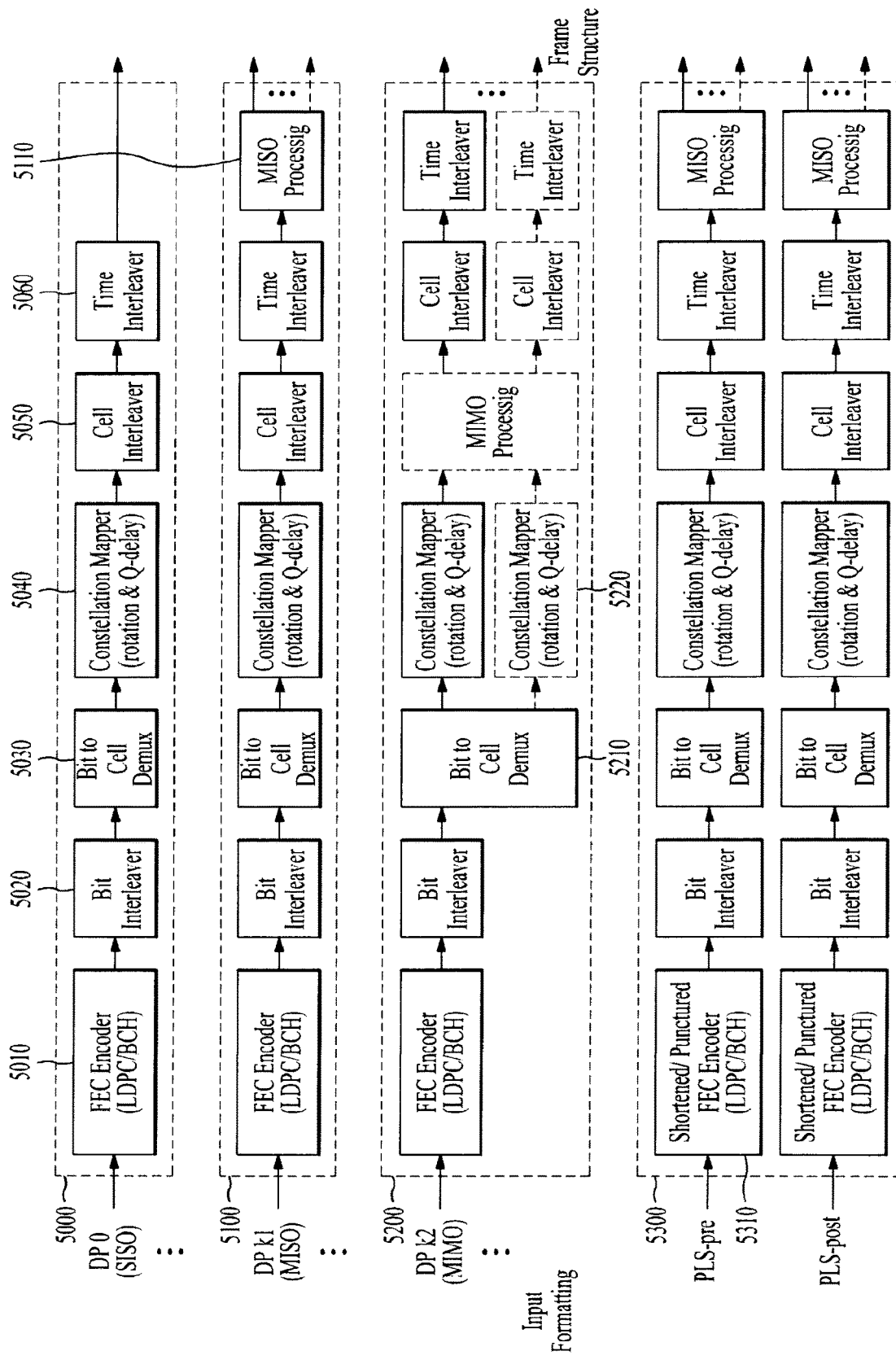
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the bit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
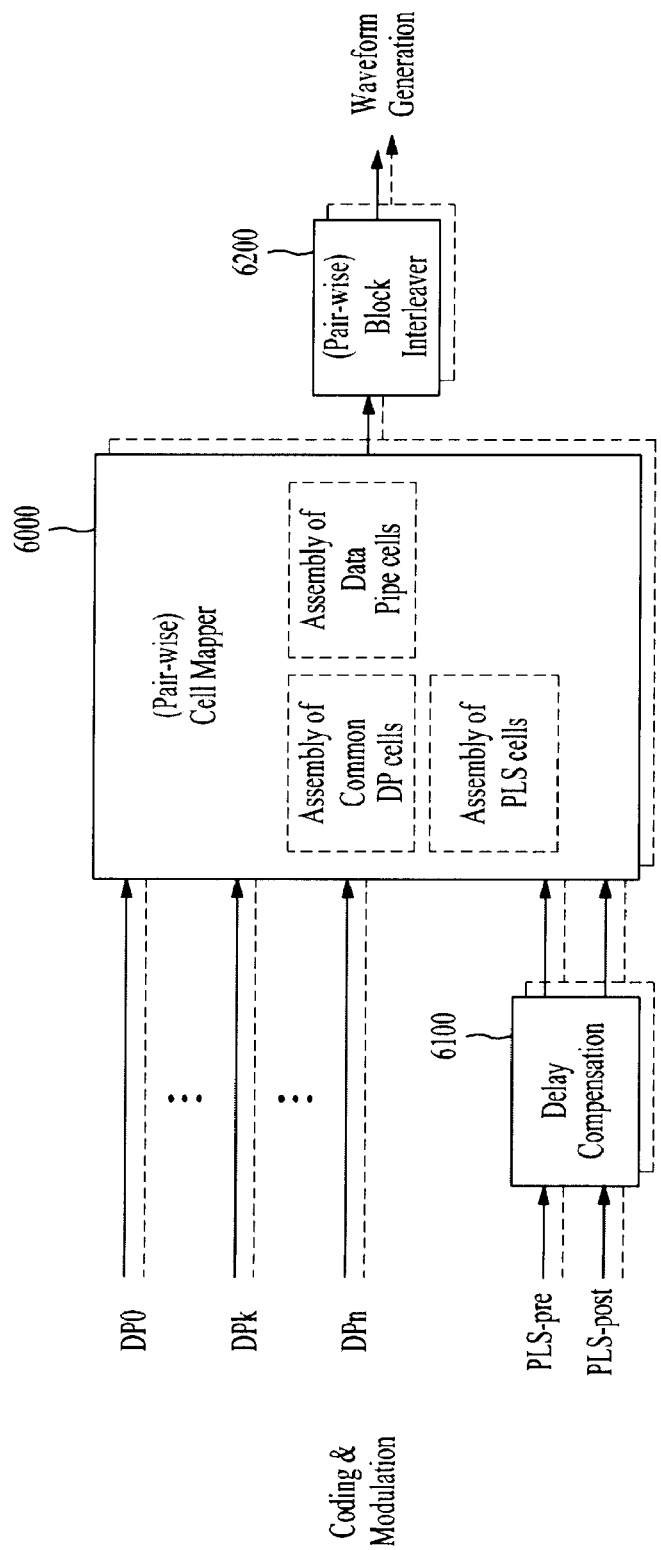
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate (or arrange) cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map (or arrange) the unit to a frame. Accordingly, paired cells in an input path corresponding to an output path of each antenna can be allocated (or arranged) to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 6, the frame structure module can output at least one signal frame to the waveform generation module.

Figure 7:
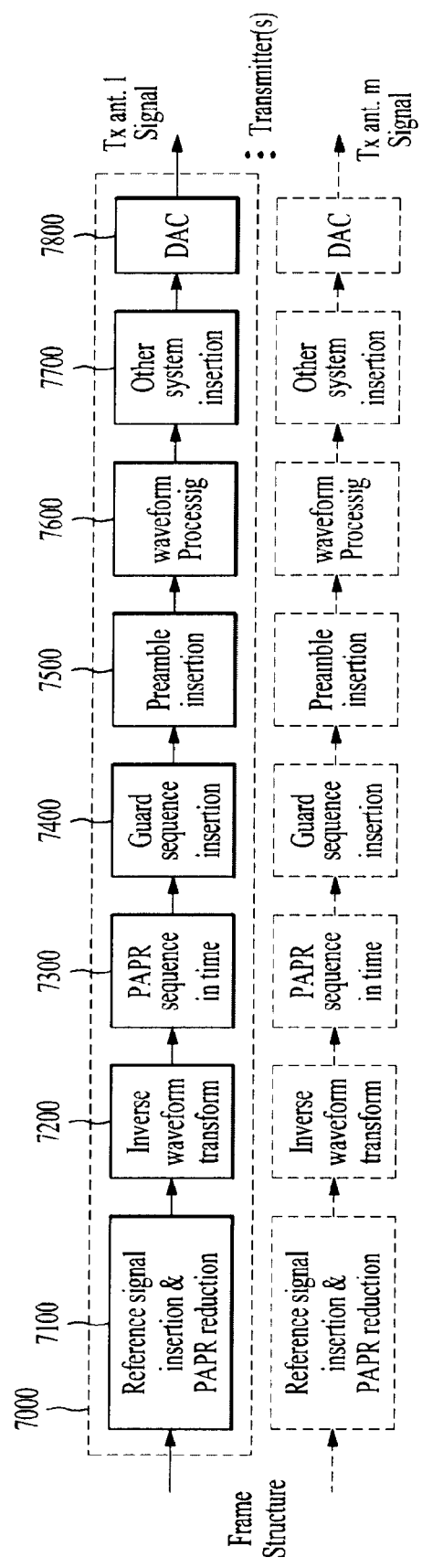
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
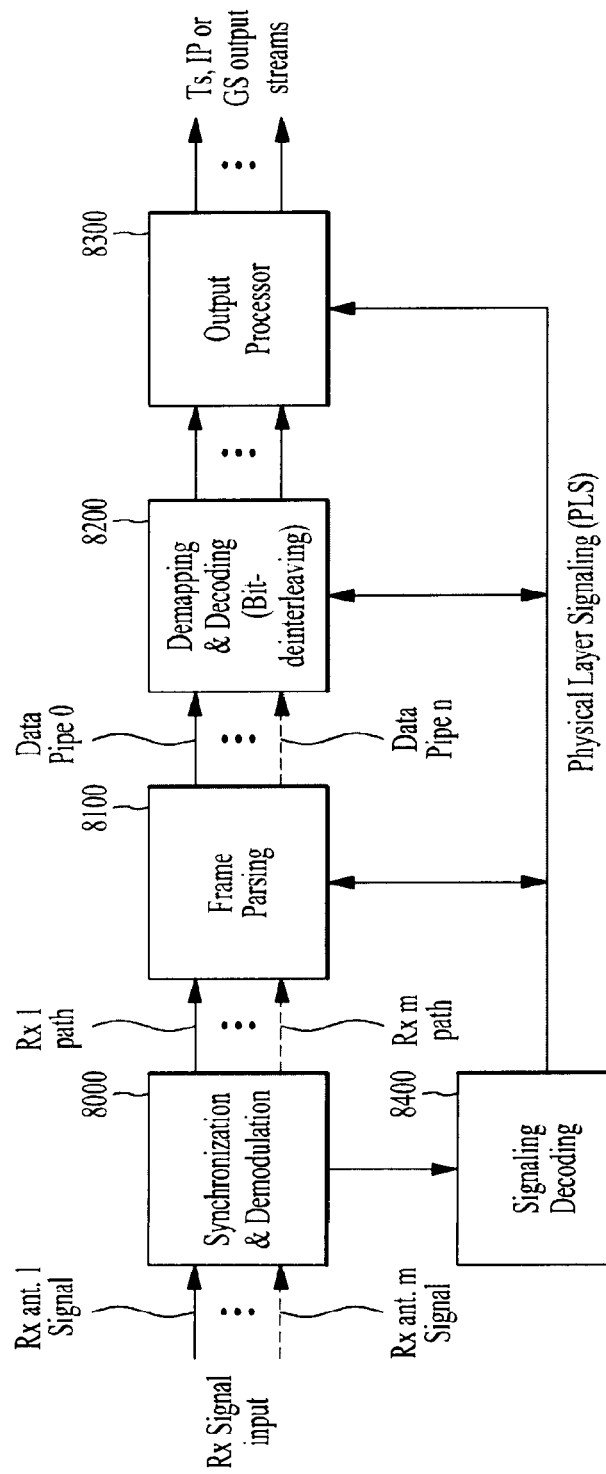
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
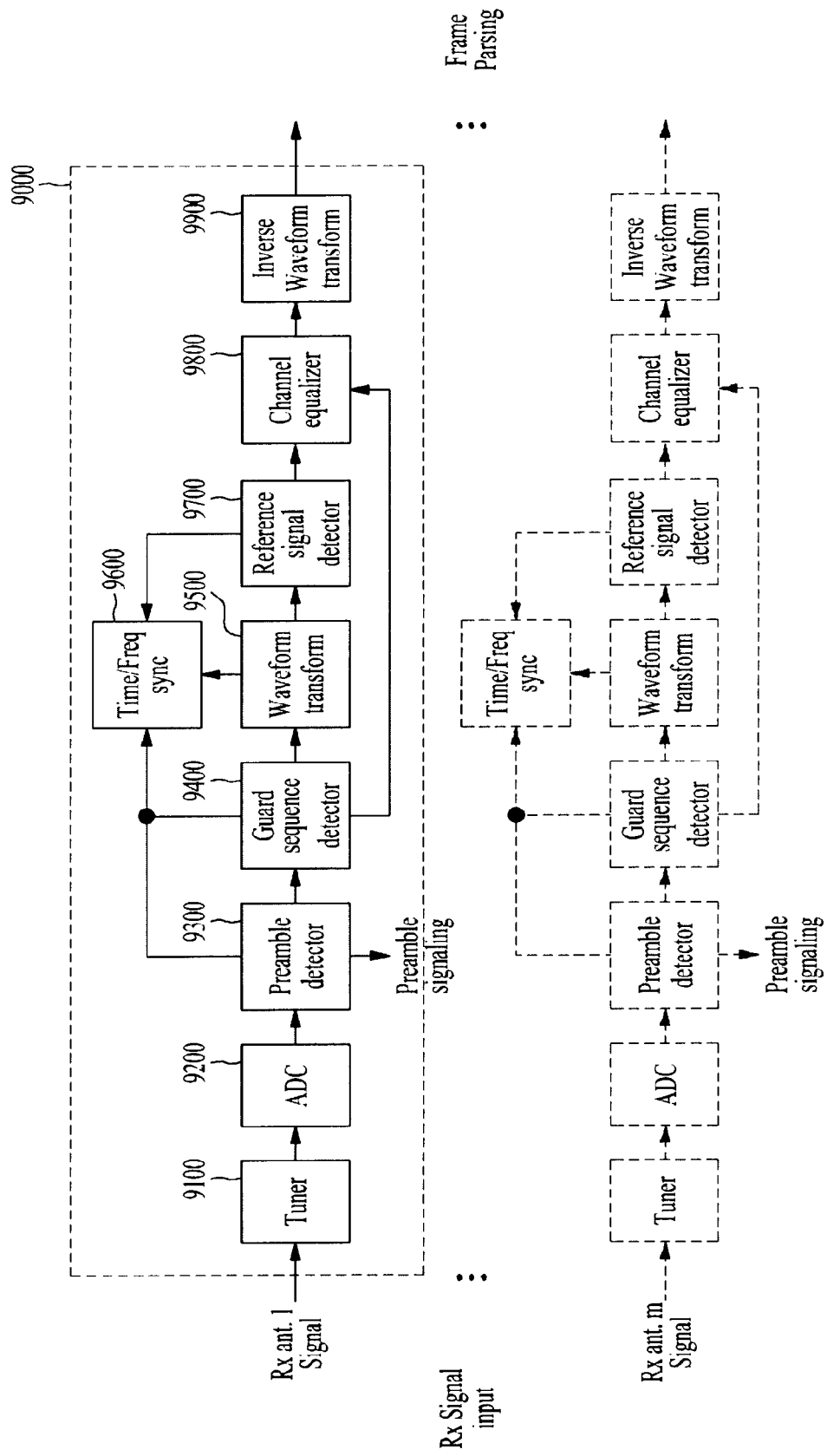
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
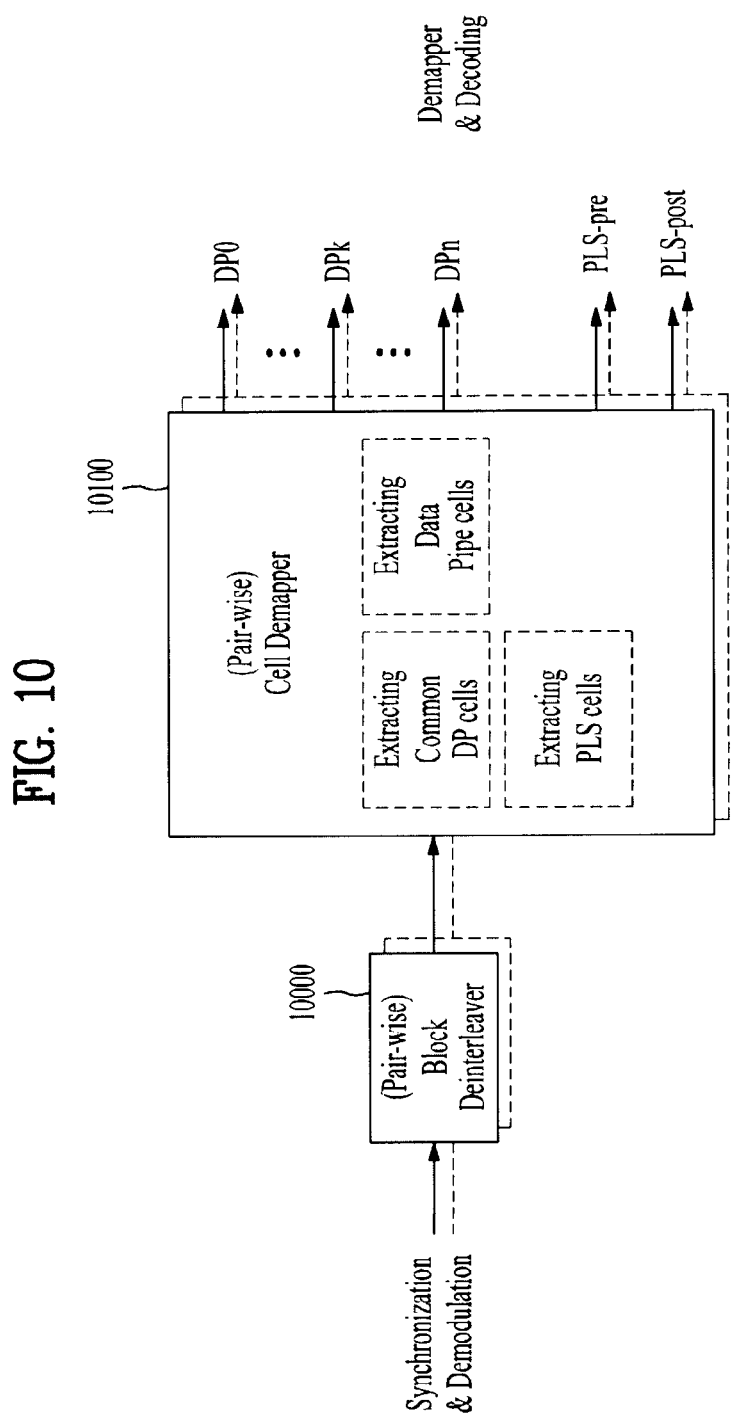
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block interleaver 10000 and at least one cell demapper 10100.

The block interleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block interleaver 10000 can process two consecutive pieces of data as a pair for each input path. Accordingly, the block interleaver 10000 can output two consecutive pieces of data even when deinterleaving has been performed. Furthermore, the block interleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
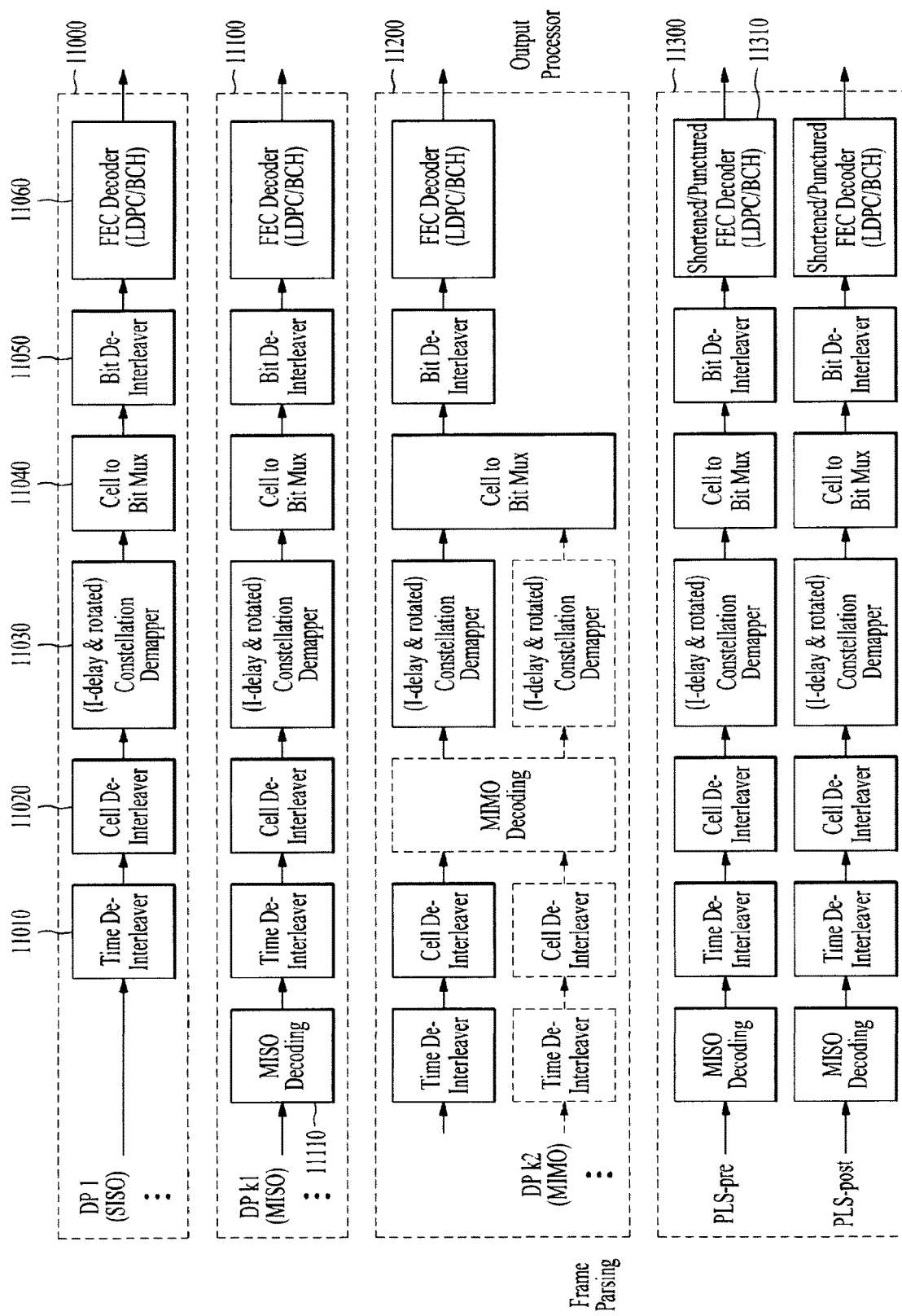
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
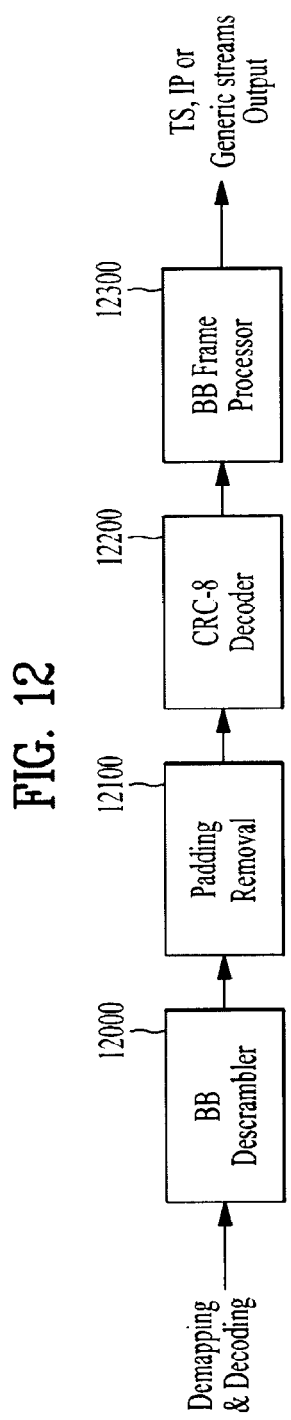
FIG. 12 illustrates an output processor according to an embodiment of the present invention.
Figure 13:
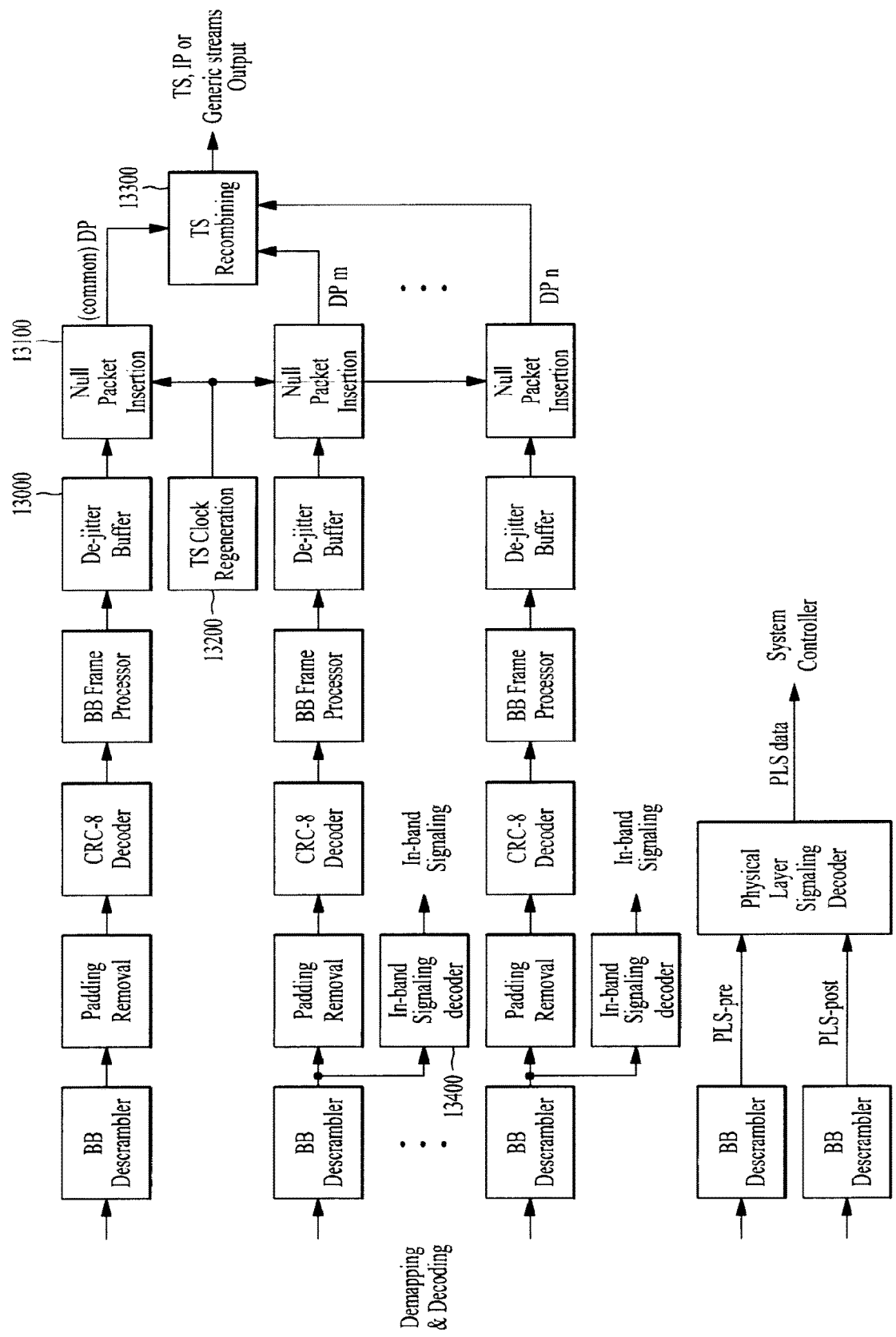
FIG. 13 illustrates an output processor according to another embodiment of the present invention.

FIGS. 12 and 13 illustrate output processors according to embodiments of the present invention.

FIG. 12 illustrates an output processor according to an embodiment of the present invention. The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention. The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
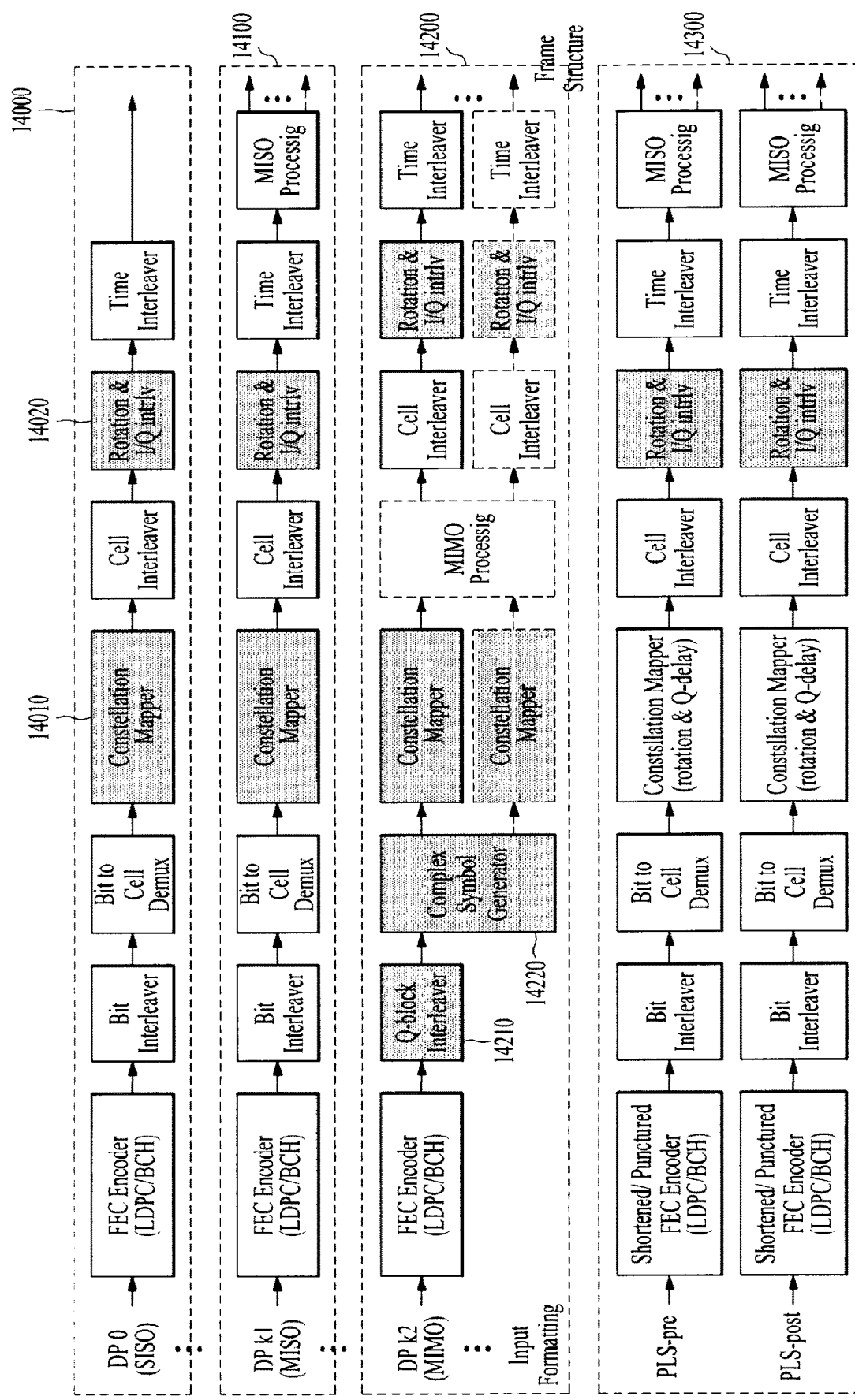
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
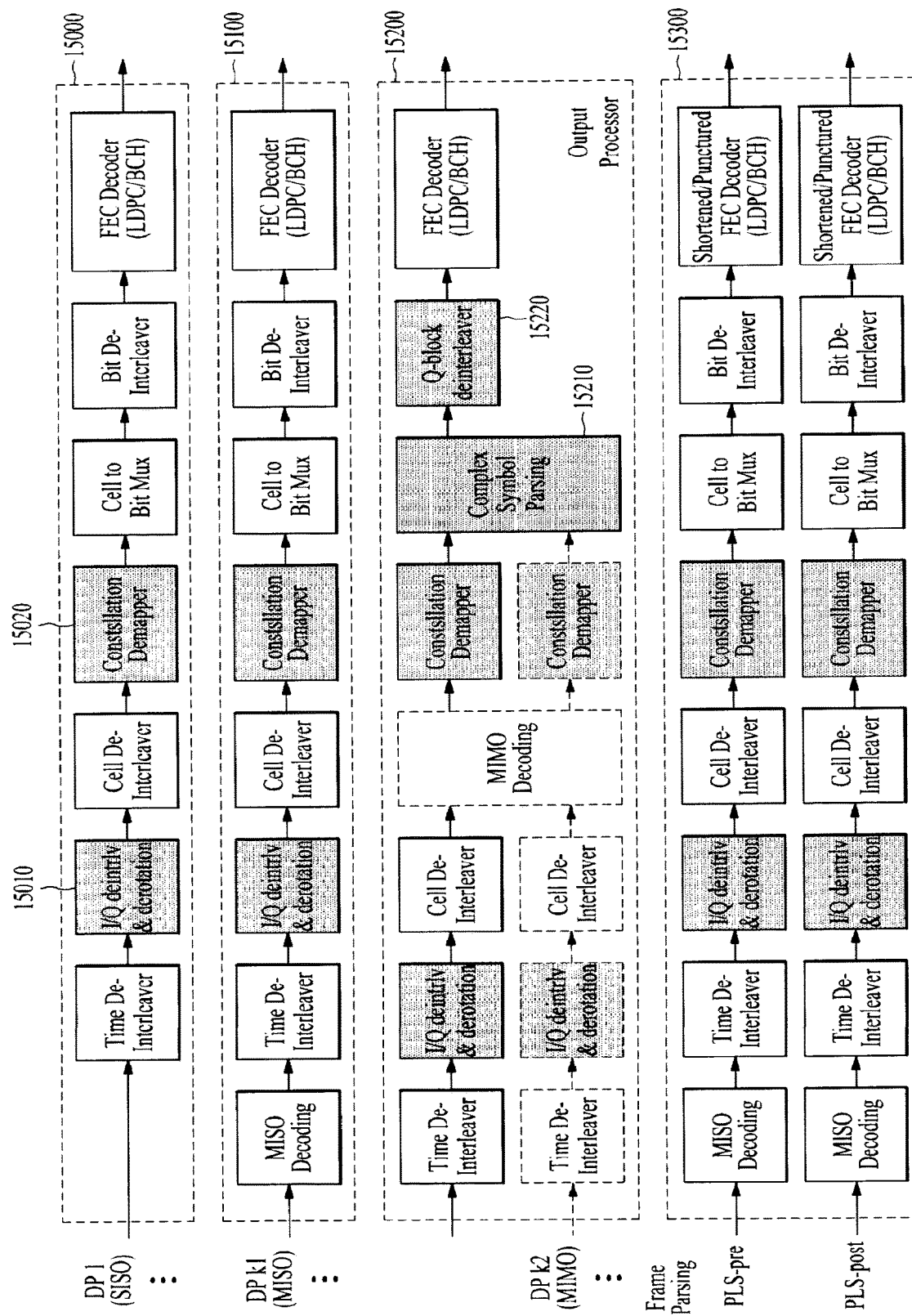
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Figure 16:
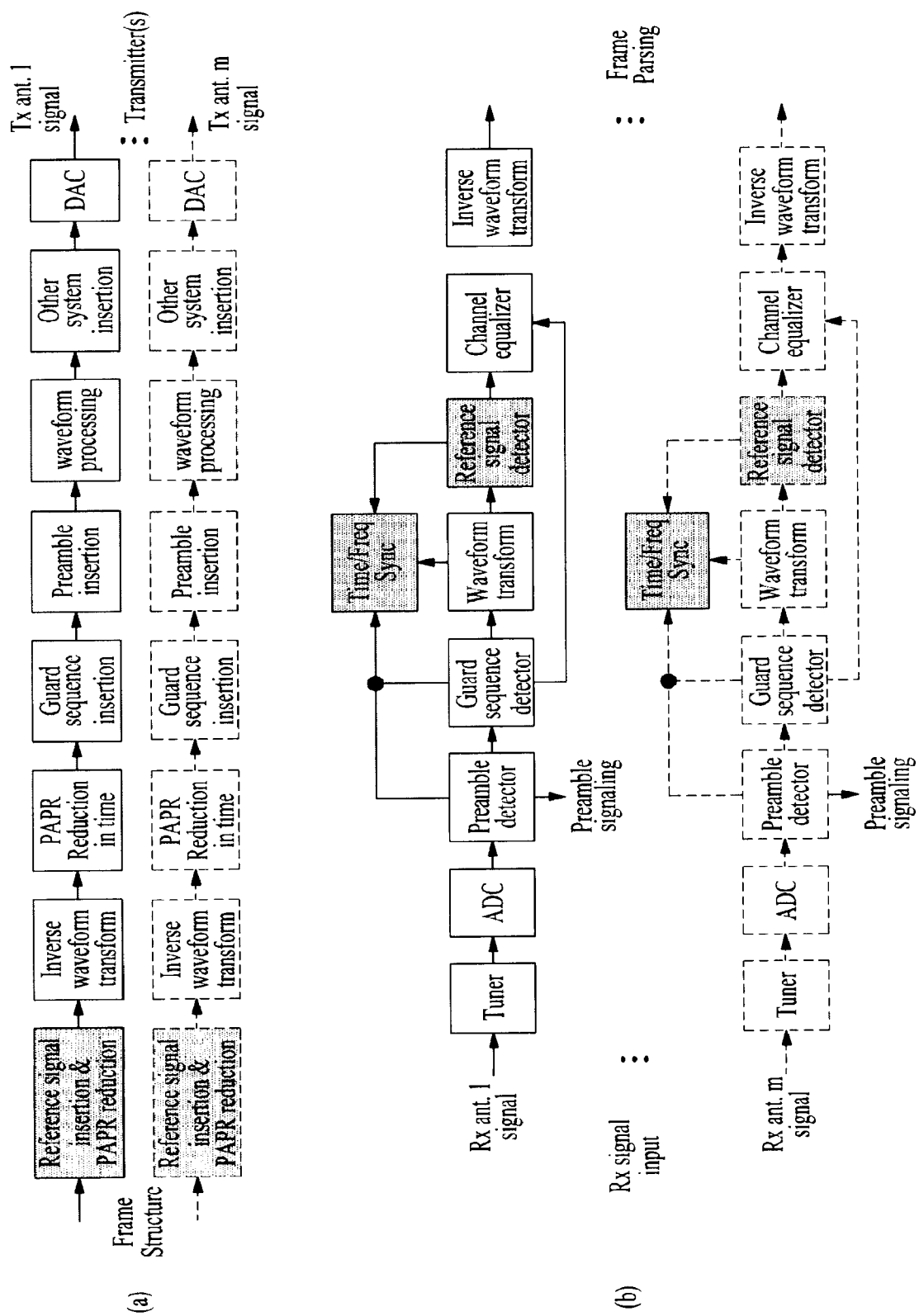
FIG. 16 illustrates a waveform generation module and a synchronization & demodulation module according to another embodiment of the present invention.

FIG. 16 illustrates a waveform generation module and a synchronization & demodulation module according to another embodiment of the present invention.

FIG. 16(*a*) shows the waveform generation module according to another embodiment of the present invention. The waveform generation module may correspond to the aforementioned waveform generation module. The waveform generation module according to another embodiment may include a new reference signal insertion & PAPR reduction block. The new reference signal insertion & PAPR reduction block may correspond to the aforementioned reference signal insertion & PAPR reduction block.

The present invention provides a method for generating a continuous pilot (CP) pattern inserted into predetermined positions of each signal block. In addition, the present invention provides a method for operating CPs using a small-capacity memory (ROM). The new reference signal insertion & PAPR reduction block according to the present invention may operate according to the methods for generating and operating a CP pattern provided by the present invention.

FIG. 16(*b*) illustrates a synchronization & demodulation module according to another embodiment of the present invention. The synchronization & demodulation module may correspond to the aforementioned synchronization & demodulation module. The synchronization & demodulation module may include a new reference signal detector. The new reference signal detector may correspond to the aforementioned reference signal detector.

The new reference signal detector according to the present invention may perform operation of a receiver using CPs according to the method for generating and operating CPs, provided by the present invention. CPs may be used for synchronization of the receiver. The new reference signal detector may detect a received reference signal to aid in synchronization or channel estimation of the receiver. Here, synchronization may be performed through coarse auto frequency control (AFC), fine AFC and/or common phase error correction (CPE).

At a transmitter, various cells of OFDM symbols may be modulated through reference information. The reference information may be called a pilot. Pilots may include a SP (scattered pilot), CP (continual pilot), edge pilot, FSS (frame signaling symbol) pilot, FES (frame edge symbol) pilot, etc. Each pilot may be transmitted at a specific boosted power level according to pilot type or pattern.

The CP may be one of the aforementioned pilots. A small quantity of CPs may be randomly distributed in OFDM symbols and operated. In this case, an index table in which CP position information is stored in a memory may be efficient. The index table may be referred to as a reference index table, a CP set, a CP group, etc. The CP set may be determined depending on FFT size and SP pattern.

CPs may be inserted into each frame. Specifically, CPs can be inserted into symbols of each frame. The CPs may be inserted in a CP pattern according to the index table. However, the size of the index table may increase as the SP pattern is diversified and the number of active carriers (NOC) increases.

To solve this problem, the present invention provides a method for operating CPs using a small-capacity memory. The present invention provides a pattern reversal method and a position multiplexing method. According to these methods, storage capacity necessary for the receiver can be decreased.

The design concept of a CP pattern may be as follows. The number of active data carriers (NOA) in each OFDM symbol is held constant. The constant NOA may conform to a predetermined NOC (or FFT mode) and SP pattern.

The CP pattern can be changed based on NOC and SP pattern to check the following two conditions: reduction of signaling information; and simplification of interaction between a time interleaver and carrier mapping.

Subsequently, CPs to be positioned in an SP-bearing carrier and a non-SP-bearing carrier can be fairly selected. This selection process may be carried out for a frequency selective channel. The selection process may be performed such that the CPs are randomly distributed with roughly even distribution over a spectrum. The number of CP positions may increase as the NOC increases. This may serve to preserve overhead of the CPs.

The pattern reversal method will now be briefly described. A CP pattern that can be used in an NOC or SP pattern may be generated based on the index table. CP position values may be arranged into an index table based on the smallest NOC. The index table may be referred to as a reference index table. Here, the CP position values may be randomly located. For a larger NOC, the index table can be extended by reversing the distribution pattern of the index table. Extension may not be achieved by simple repetition according to a conventional technique. Cyclic shifting may precede reversal of the distribution pattern of the index table according to an embodiment. According to the pattern reversal method, CPs can be operated even with a small-capacity memory. The pattern reversal method may be applied to NOC and SP modes. In addition, according to the pattern reversal method, CP positions may be evenly and randomly distributed over the spectrum. The pattern reversal method will be described in more detail later.

The position multiplexing method will now be briefly described. Like the pattern reversal method, a CP pattern that can be used in the NOC or SP pattern may be generated based on the index table. First, position values for randomly positioning CPs may be aligned into an index table. This index table may be referred to as a reference index table. The index table may be designed in a sufficiently large size to be used for/applied to all NOC modes. Then, the index table may be multiplexed through various methods such that CP positions are evenly and randomly distributed over the spectrum for an arbitrary NOC. The position multiplexing method will be described in more detail later.

Figure 17:
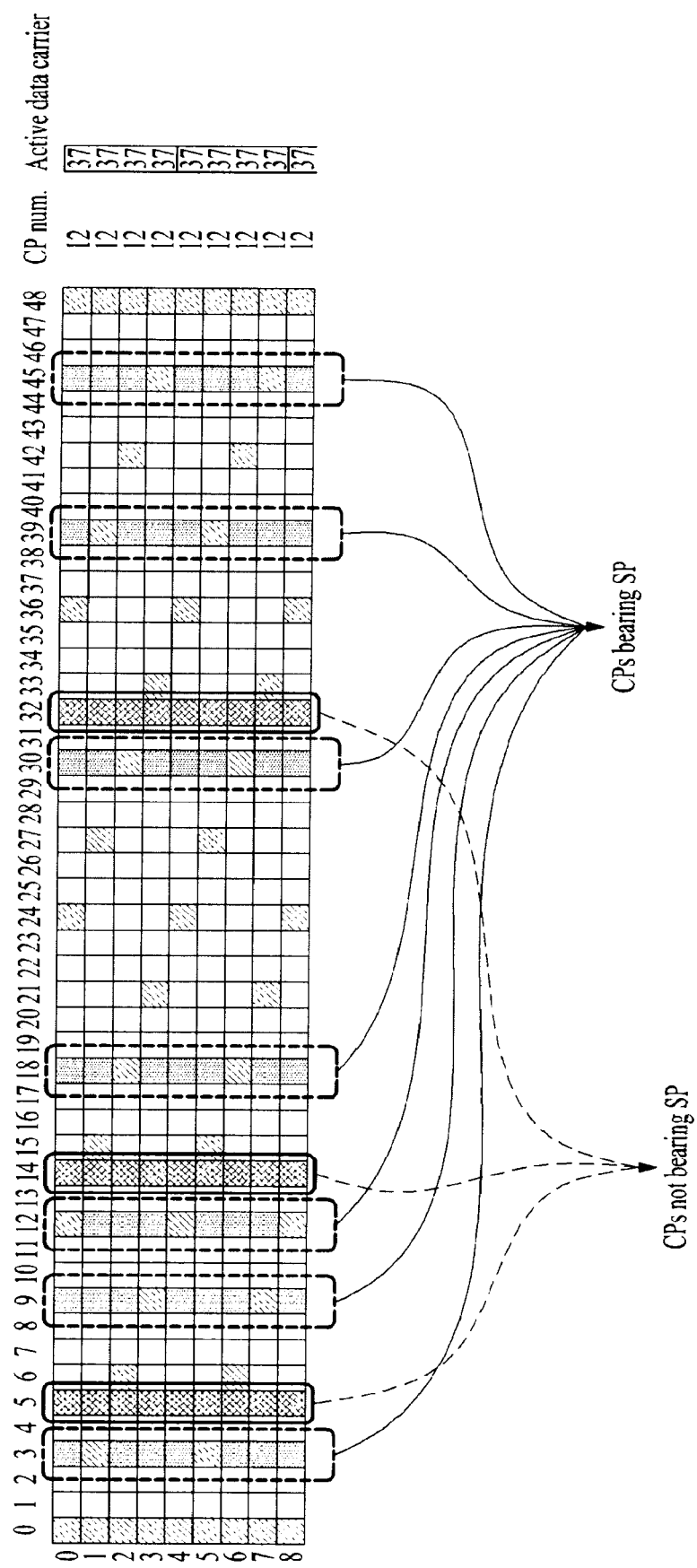
FIG. 17 illustrates definition of a CP bearing SP and a CP not bearing SP according to an embodiment of the present invention.

FIG. 17 illustrates definition of a CP bearing SP and a CP not bearing SP according to an embodiment of the present invention.

A description will be given of a random CP position generator prior to description of the pattern reversal method and the position multiplexing method. The pattern reversal method and the position multiplexing method may require the random CP position generator.

Several assumptions may be necessary for the random CP position generator. First, it can be assumed that CP positions are randomly selected by a PN generator at a predetermined NOC. That is, it can be assumed that the CP positions are randomly generated using a PRBS generator and provided to the reference index table. It can be assumed that the NOA in each OFDM symbol is constantly maintained. The NOA in each OFDM symbol may be constantly maintained by appropriately selecting CP bearing SPs and CP not bearing SPs.

In FIG. 17, uncolored portions represent CP not bearing SPs and colored portions represent CP bearing SPs.

Figure 18:
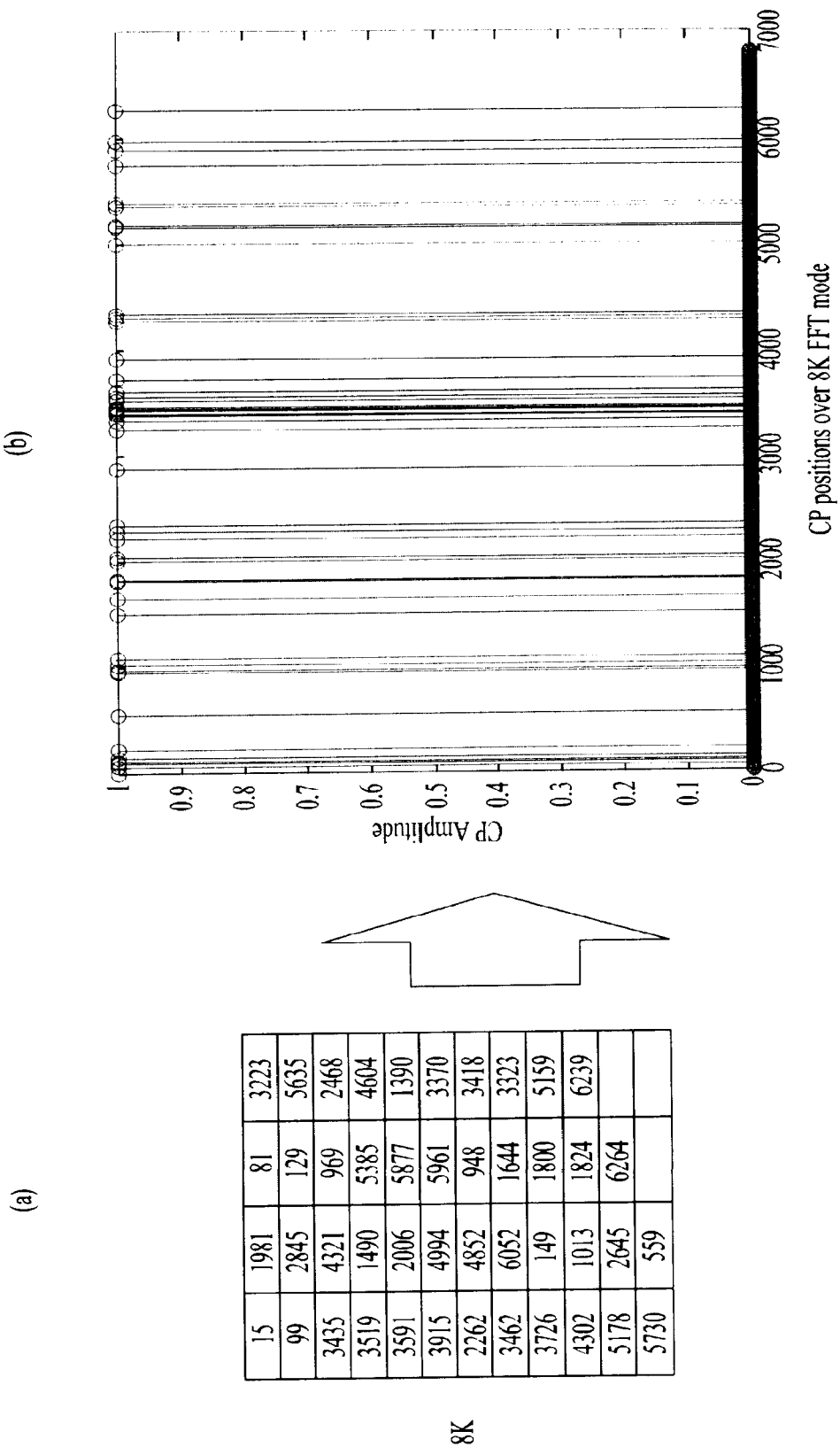
FIG. 18 shows a reference index table according to an embodiment of the present invention.

FIG. 18 shows a reference index table according to an embodiment of the present invention.

The reference index table shown in FIG. 18 may be a reference index table generated using the aforementioned assumptions. The reference index table considers 8K FFT mode (NOC: 6817) and SP mode (Dx:2, Dy:4). The index table shown in FIG. 18(a) may be represented as a graph shown in FIG. 18(b).

Figure 19:
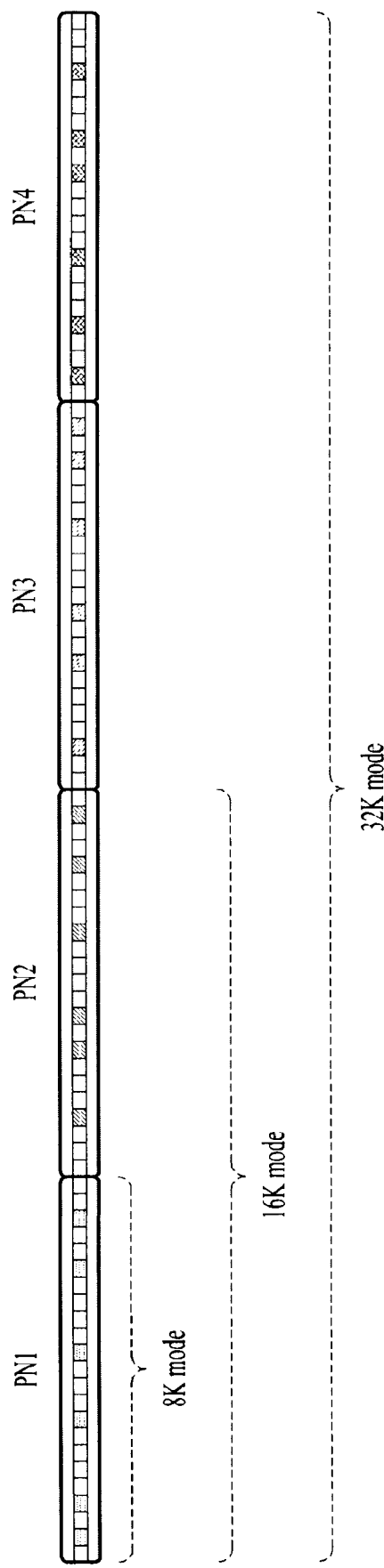
FIG. 19 illustrates the concept of configuring a reference index table in CP pattern generation method #1 using the position multiplexing method.

FIG. 19 illustrates the concept of configuring a reference index table in CP pattern generation method #1 using the position multiplexing method.

A description will be given of CP pattern generation method #1 using the position multiplexing method.

When a reference index table is generated, the index table can be divided into sub index tables having a predetermined size. Different PN generators (or different seeds) may be used for the sub index tables to generate CP positions. FIG. 19 shows a reference index table considering 8, 16 and 32K FFT modes. That is, in the case of 8K FFT mode, a single sub index table can be generated by PN1. In the case of 16K FFT mode, two sub index tables can be respectively generated by PN1 and PN2. The CP positions may be generated based on the aforementioned assumptions.

For example, when the 16K FFT mode is supported, CP position values obtained through a PN1 and PN2 generator can be sequentially arranged to distribute all CP positions. When the 32K FFT mode is supported, CP position values obtained through a PN3 and PN4 generator can be additionally arranged to distribute all CP positions.

Accordingly, CPs can be evenly and randomly distributed over the spectrum. In addition, a correlation property between CP positions can be provided.

FIG. 20 illustrates a method for generating a reference index table in CP pattern generation method #1 using the position multiplexing method according to an embodiment of the present invention.

In the present embodiment, CP position information may be generated in consideration of an SP pattern with Dx=3 and Dy=4. In addition, the present embodiment may be implemented in 8K/16K/32K FFT modes (NOC: 1817/13633/27265).

CP position values may be stored in a sub index table using the 8K FFT mode as a basic mode. When 16K or higher FFT modes are supported, sub index tables may be added to the stored basic sub index table. Values of the added sub index tables may be obtained by adding a predetermined value to the stored basic sub index table or shifting the basic sub index table.

CP position values provided to the ends of sub index tables PN1, PN2 and PN3 may refer to values necessary when the corresponding sub index tables are extended. That is, the CP position values may be values for multiplexing. The CP position values provided to the ends of the sub index tables are indicated by ovals in FIG. 20.

The CP position values v provided to the ends of the sub index tables may be represented as follows.

$$v = i \cdot D_x \cdot D_y \quad \text{[Expression 1]}$$

Here, v can be represented as an integer multiple i of $D_x \cdot D_y$. When the 8K FFT mode is applied, the last position value of sub index table PN1 may not be applied. When the 16K FFT mode is applied, the last position value of sub index table PN1 is applied whereas the last position value of sub index table PN2 may not be applied. Similarly, when the 32K FFT mode is applied, all the last position values of sub index tables PN1, PN2 and PN3 may be applied.

In CP pattern generation method #1 using the position multiplexing method, the aforementioned multiplexing rule can be represented by the following Expression. The following Expression may be an equation for generating CP positions to be used in each FFT mode from a predetermined reference index table.

$$CP\_8K(k) = PN1(k), \text{ for } 1 \le k \le S_{PN1} - 1 \quad \text{[Expression 2]}$$

$$CP\_16K(k) = \begin{cases} PN1(k), \text{ if } 1 \le k \le S_{PN1} \\ \alpha_1 + PN2(k - S_{PN1}), \text{ elseif } S_{PN1} + 1 \le k \le S_{PN12} - 1 \end{cases}$$

$$CP\_32K(k) = \begin{cases} PN1(k), \text{ if } 1 \le k \le S_{PN1} \\ \alpha_1 + PN2(k - S_{PN1}), \text{ elseif } S_{PN1} + 1 \le k \le S_{PN12} \\ \alpha_2 + PN3(k - S_{PN12}), \text{ elseif } S_{PN12} + 1 \le k \le S_{PN123} \\ \alpha_3 + PN4(k - S_{PN123}), \text{ elseif } S_{PN123} + 1 \le k \le S_{PN1234} \end{cases}$$

where $$S_{PN12} = S_{PN1} + S_{PN2}$$

$$S_{PN123} = S_{PN1} + S_{PN2} + S_{PN3}$$

$$S_{PN1234} = S_{PN1} + S_{PN2} + S_{PN3} + S_{PN4}$$

Expression 2 may be an equation for generating CP position values to be used in each FFT mode based on the predetermined reference index table. Here, CP_8/16/32K respectively denote CP patterns in 8K, 16K and 32K FFT modes and PN_1/2/3/4 denote sub index table names. $S_{PN\_1/2/3/4}$ respectively represent the sizes of sub index tables PN1, PN2, PN3 and PN4 and $\alpha_{1/2/3}$ represent shifting values for evenly distributing added CP positions.

In CP_8K(k) and CP_16K(k), k is limited to $S_{PN1}-1$ and $S_{PN12}-1$. Here, -1 is added since the last CP position value v is excluded, as described above.

Figure 21:
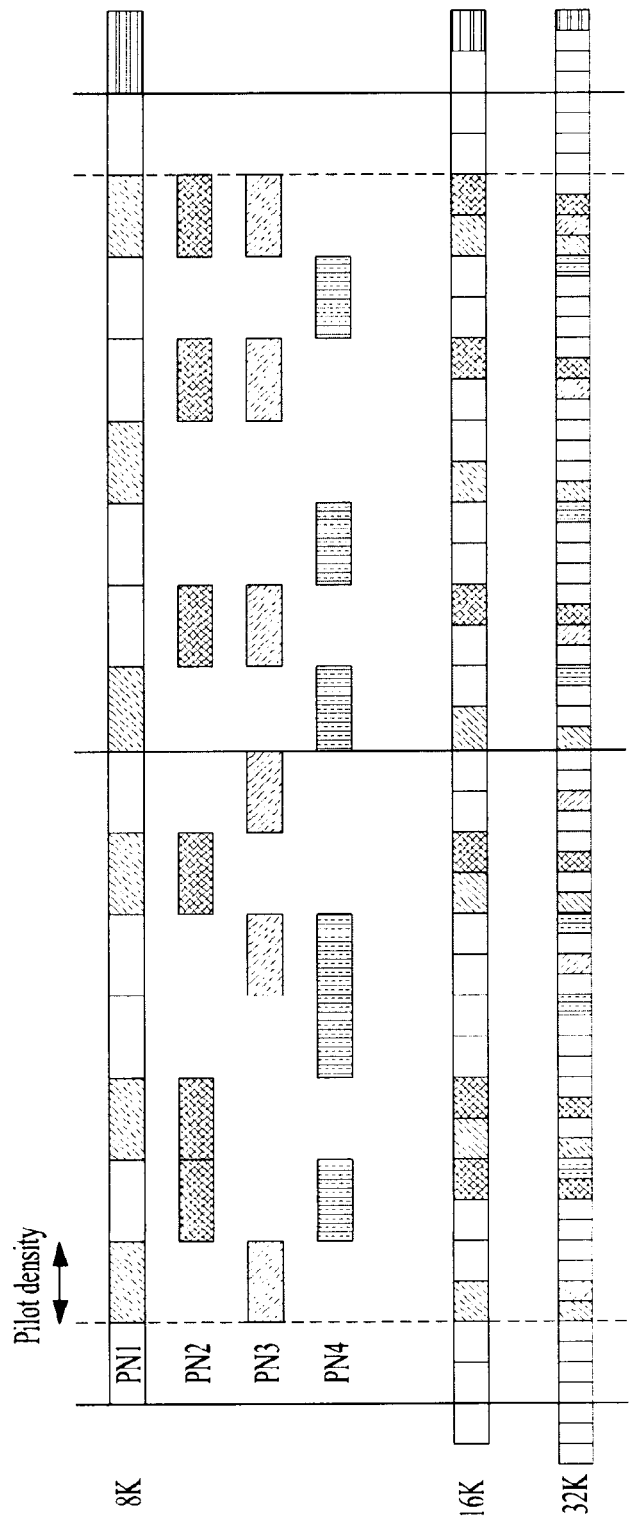
FIG. 21 illustrates the concept of configuring a reference index table in CP pattern generation method #2 using the position multiplexing method according to an embodiment of the present invention.

FIG. 21 illustrates the concept of configuring a reference index table in CP pattern generation method #2 using the position multiplexing method according to an embodiment of the present invention.

CP pattern generation method #2 using the position multiplexing method will now be described.

CP pattern generation method #2 using the position multiplexing method may be performed in a manner that a CP pattern according to FFT mode is supported. CP pattern generation method #2 may be performed in such a manner that PN1, PN2, PN3 and PN4 are multiplexed to support a CP suited to each FFT mode. Here, PN1, PN2, PN3 and PN4 are sub index tables and may be composed of CP positions generated by different PN generators. PN1, PN2, PN3 and PN4 may be assumed to be sequences in which CP position values are distributed randomly and evenly. While the reference index table may be generated through a method similar to the aforementioned CP pattern generation method #1 using the position multiplexing method, a detailed multiplexing method may differ from CP pattern generation method #1.

A pilot density block can be represented as $N_{blk}$. The number of allocated pilot density blocks $N_{blk}$ may depend on FFT mode in the same bandwidth. That is, one pilot density block $N_{blk}$ may be allocated in the case of 8K FFT mode, two pilot density blocks $N_{blk}$ may be allocated in the case of 16K FFT mode and four pilot density blocks $N_{blk}$ may be allocated in the case of 32K FFT mode. PN1 to PN4 may be multiplexed in an allocated region according to FFT mode to generate CP patterns.

PN1 to PN4 may be generated such that a random and even CP distribution is obtained. Accordingly, the influence of an arbitrary specific channel may be mitigated. Particularly, PN1 can be designed such that corresponding CP position values are disposed in the same positions in physical spectrums of 8K, 16K and 32K. In this case, a reception algorithm for synchronization can be implemented using simple PN1.

In addition, PN1 to PN4 may be designed such that they have excellent cross correlation characteristics and auto correlation characteristics.

In the case of PN2 in which CP positions are additionally determined in the 16K FFT mode, the CP positions can be determined such that PN2 has excellent auto correlation characteristics and even distribution characteristics with respect to the position of PN1 determined in the 8K FFT mode. Similarly, in the case of PN3 and PN4 in which CP positions are additionally determined in the 32K FFT mode, the CP positions can be determined such that auto correlation characteristics and even distribution characteristics are optimized based on the positions of PN1 and PN2 determined in 16K FFT mode.

CPs may not be disposed in predetermined portions of both edges of the spectrum. Accordingly, it is possible to mitigate loss of some CPs when an integral frequency offset (ICFO) is generated.

Figure 22:
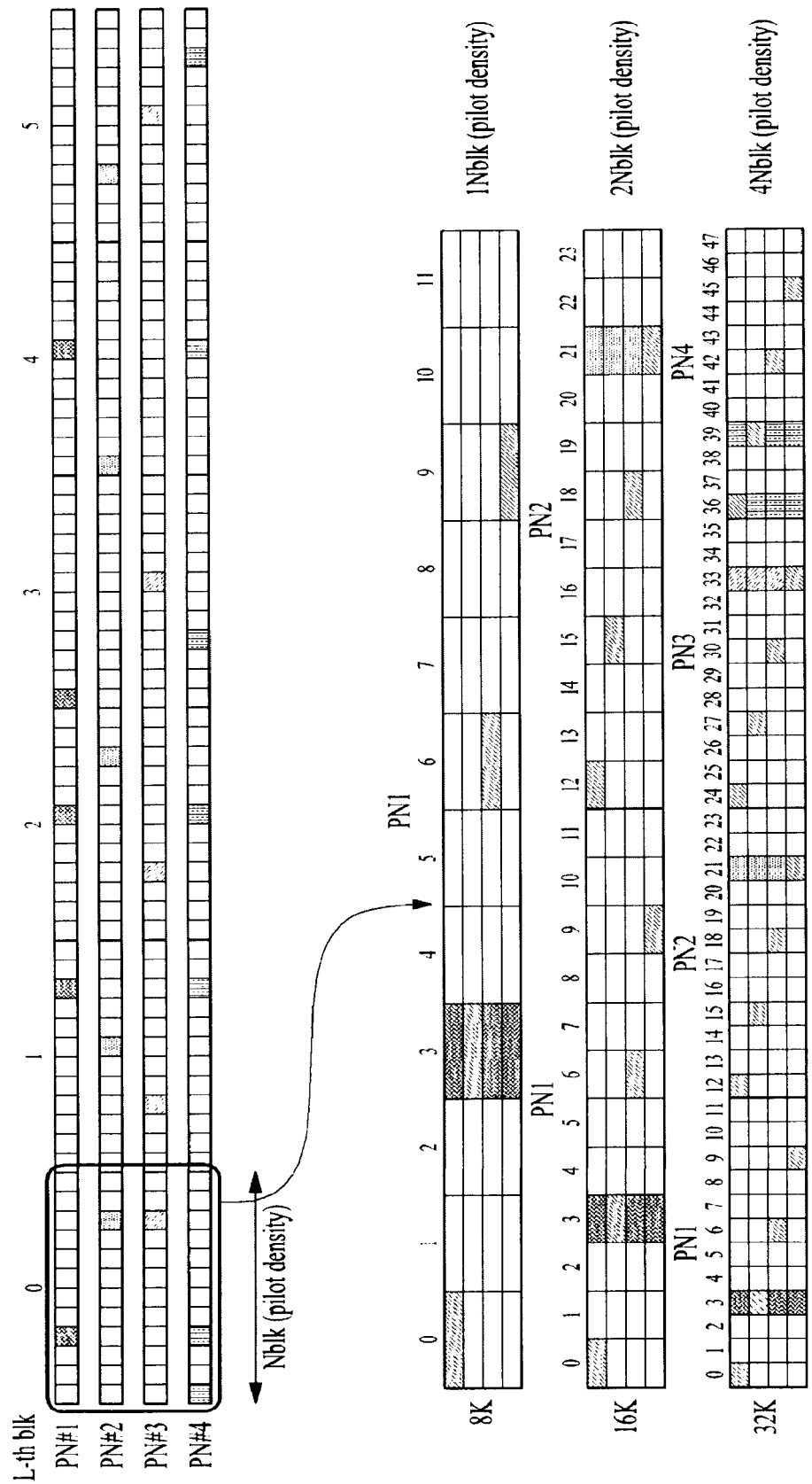
FIG. 22 illustrates a method for generating a reference index table in CP pattern generation method #2 using the position multiplexing method.

FIG. 22 illustrates a method for generating a reference index table in CP pattern generation method #2 using the position multiplexing method.

PN1 can be generated in case of the 8K FFT mode, PN1 and PN2 can be generated in case of the 16K FFT mode and PN1, PN2, PN3 and PN4 can be generated in case of the 32K FFT mode. The generation process may be performed according to a predetermined multiplexing rule.

FIG. 22 illustrates that two pilot density blocks $N_{blk}$ in case of the 16K FFT mode and four pilot density blocks $N_{blk}$ in case of the 32K FFT mode can be included in a region which can be represented by a single pilot density block $N_{blk}$ on the basis of the 8K FFT mode. PNs generated according to each FFT mode can be multiplexed to generate a CP pattern.

In the case of 8K FFT mode, a CP pattern can be generated using PN1. That is, PN1 may be a CP pattern in the 8K FFT mode.

In the case of 16K FFT mode, PN1 can be positioned in the first pilot density block (first $N_{blk}$) and PN2 can be disposed in the second pilot density block (second $N_{blk}$) to generate a CP pattern.

In the case of 32K FFT mode, PN1 can be disposed in the first pilot density block (first $N_{blk}$), PN2 can be disposed in the second pilot density block (second $N_{blk}$), PN3 can be disposed in the third pilot density block (third $N_{blk}$) and PN4 can be disposed in the fourth pilot density block (fourth $N_{blk}$) to generate a CP pattern. While PN1, PN2, PN3 and PN4 are sequentially disposed in the present embodiment, PN2 may be disposed in the third pilot density block (third $N_{blk}$) in order to insert CPs into similar positions of the spectrum as in the 16K FFT mode.

In CP pattern generation method #2 using the position multiplexing method, the aforementioned multiplexing rule can be represented by the following Expression. The following Expression may be an equation for generating CP positions to be used in each FFT mode from a predetermined reference index table.

[Expression 3]

$$CP\_8K(k) = PN1(k),$$

$$CP\_16K(k) = \begin{cases} PN1\left(\text{ceil}\left(\frac{k}{2N_{blk}}\right) \cdot N_{blk} + \text{mod}(k, 2N_{blk})\right), & 0 \leq \text{mod}(k, 2N_{blk}) N_{blk} \\ PN2\left(\text{ceil}\left(\frac{k}{2N_{blk}}\right) \cdot N_{blk} + \text{mod}((k - N_{blk}), 2N_{blk})\right), & N_{blk} \leq \text{mod}(k, 2N_{blk}) < 2N_{blk} \end{cases}$$

$$CP\_32K(k) = \begin{cases} PN1\left(\text{ceil}\left(\frac{k}{4N_{blk}}\right) \cdot N_{blk} + \text{mod}(k, 4N_{blk})\right), & 0 \leq \text{mod}(k, 4N_{blk}) N_{blk} \\ PN2\left(\text{ceil}\left(\frac{k}{4N_{blk}}\right) \cdot N_{blk} + \text{mod}((k - N_{blk}), 4N_{blk})\right), & N_{blk} \leq \text{mod}(k, 4N_{blk}) < 2N_{blk} \\ PN3\left(\text{ceil}\left(\frac{k}{4N_{blk}}\right) \cdot N_{blk} + \text{mod}((k - 2N_{blk}), 4N_{blk})\right), & 2N_{blk} \leq \text{mod}(k, 4N_{blk}) < 3N_{blk} \\ PN4\left(\text{ceil}\left(\frac{k}{4N_{blk}}\right) \cdot N_{blk} + \text{mod}((k - 3N_{blk}), 4N_{blk})\right), & 3N_{blk} \leq \text{mod}(k, 4N_{blk}) < 4N_{blk} \end{cases}$$

Expression 3 may be an equation for generating CP position values to be used in each FFT mode based on the predetermined reference index table. Here, CP_8/16/32K respectively denote CP patterns in 8K, 16K and 32K FFT modes and PN1 to PN4 denote sequences. These sequences may be four pseudo random sequences. In addition, ceil(X), ceiling function of X, represents a function outputting a minimum value from among integers equal to or greater than X and mod(X,N) is a modulo function capable of outputting a remainder obtained when X is divided by N.

For the 16K FFT mode and the 32K FFT mode, sequences PN1 to PN4 may be multiplexed in offset positions determined according to each FFT mode. In the above Expression, offset values may be represented by modulo operation values of predetermined integer multiples of basic $N_{blk}$. The offset values may be different values.

Figure 23:
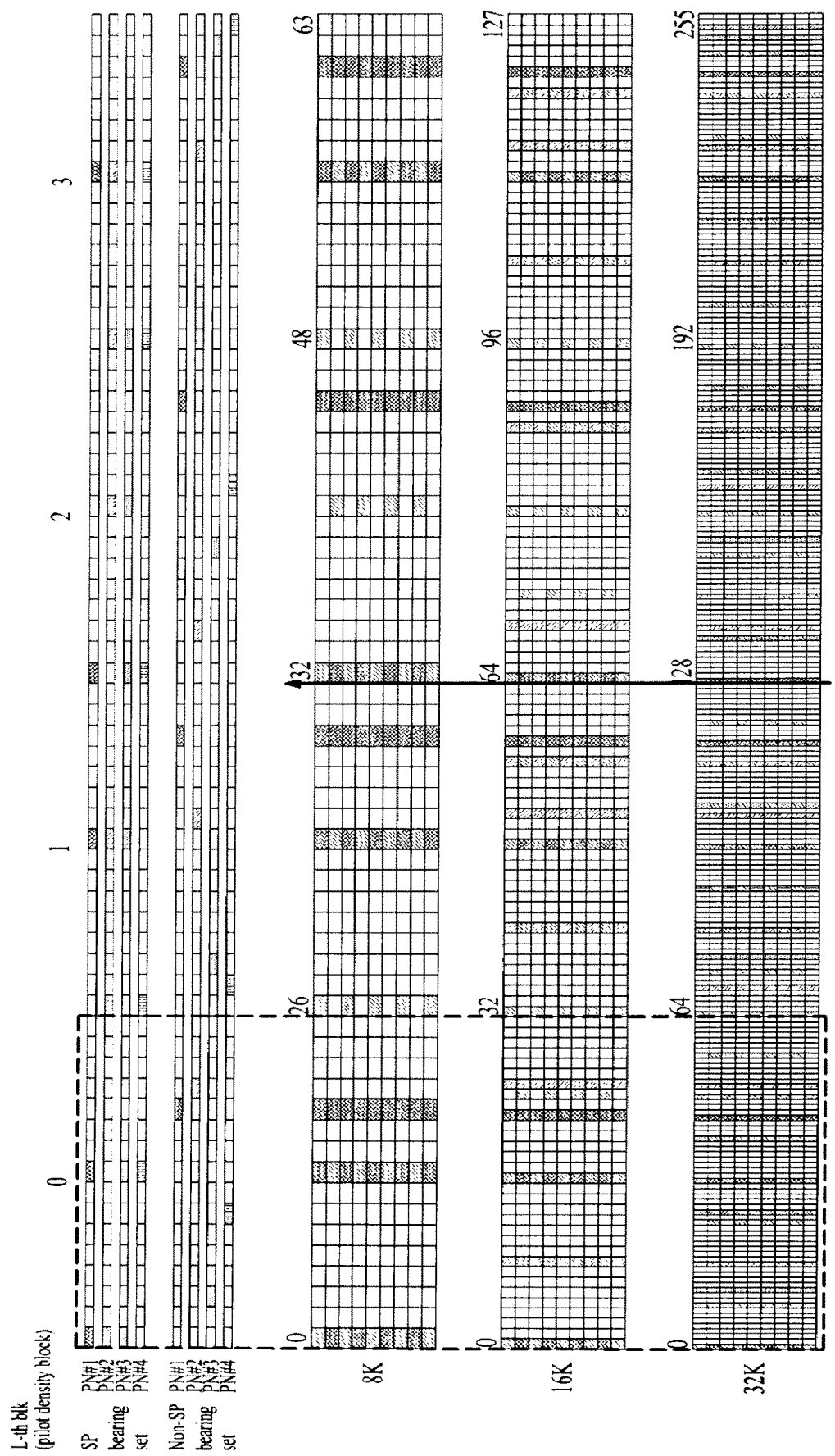
FIG. 23 illustrates a method for generating a reference index table in CP pattern generation method #3 using the position multiplexing method according to an embodiment of the present invention.

FIG. 23 illustrates a method for generating a reference index table in CP pattern generation method #3 using the position multiplexing method according to an embodiment of the present invention.

In the present embodiment, PN1 to PN4 may be assumed to be sequences in which CP position values are distributed randomly and evenly. In addition, PN1 to PN4 may be optimized to satisfy correlation and even distribution characteristics for 8K, 16K and 32K, as described above.

The present embodiment may relate to a scattered pilot pattern for channel estimation. In addition, the present embodiment may relate to a case in which distance Dx in the frequency direction is 8 and distance Dy in the time direction is 2. The present embodiment may be applicable to other patterns.

As described above, PN1 can be generated in the case of 8K FFT mode, PN1 and PN2 can be generated in the case of 16K FFT mode and PN1, PN2, PN3 and PN4 can be generated in the case of 32K FFT mode. The generation process may be performed according to a predetermined multiplexing rule.

FIG. 23 shows that two pilot density blocks $N_{blk}$ in case of the 16K FFT mode and four pilot density blocks $N_{blk}$ in case of the 32K FFT mode can be included in a region which can be represented by a single pilot density block $N_{blk}$ on the basis of the 8K FFT mode.

PNs generated according to each FFT mode can be multiplexed to generate a CP pattern. In each FFT mode, CPs may be disposed overlapping with SPs (SP bearing) or disposed not overlapping with SPs (non-SP bearing). In the present embodiment, a multiplexing rule for SP bearing or non-SP bearing CP positioning can be applied in order to dispose pilots in the same positions in the frequency domain.

In the case of SP bearing, PN1 to PN4 may be disposed such that CP positions are distributed randomly and evenly for an SP offset pattern. Here, PN1 to PN4 may be sequences forming an SP bearing set. PN1 to PN4 may be positioned according to the multiplexing rule for each FFT mode. That is, in the case of 16K FFT mode, PN2 added to PN1 can be disposed in positions other than an SP offset pattern in which PN1 is positioned. A position offset with respect to PN2 may be set such that PN2 is positioned in positions other than the SP offset pattern in which PN1 is positioned or PN2 may be disposed in a pattern determined through a relational expression. Similarly, in the case of 32K FFT mode, PN3 and PN4 may be configured to be disposed in positions other than SP offset patterns in which PN1 and PN2 are positioned.

In case of non-SP bearing, PN1 to PN4 may be positioned according to a relational expression. Here, PN1 to PN4 may be sequences forming a non-SP bearing set.

In CP pattern generation method #3 using the position multiplexing method, the aforementioned multiplexing rule can be represented by the following Expression s. The following Expression s may be equations for generating CP positions to be used in each FFT mode from a predetermined reference index table.

1) SP bearing set: [Expression 4]

$PN1_{sp}(k), PN2_{sp}(k), PN3_{sp}(k), PN4_{sp}(k)$ $CP_{sp\_8K}(k) = PN1_{sp}(k),$ $CP_{sp\_16K}(k) = \begin{cases} PN1_{sp}(k) \times 2, \\ PN2_{sp}(k) \times 2 + \alpha_{16K} \end{cases},$ $CP_{sp\_32K}(k) =$ $\begin{cases} CP\_16K(k) * 2 = \begin{cases} (PN1_{sp}(k) \times 2) \times 2 \\ (PN1_{sp}(k) \times 2 + \alpha_{16K}) \times 2 \end{cases} \\ PN3_{sp}(k) * 4 + \alpha 1_{32K} \\ PN4_{sp}(k) * 4 + \alpha 2_{32K} \end{cases}$ 2) Non SP bearing set: [Expression 5]

$PN1_{nonsp}(k), PN2_{nonsp}(k), PN3_{nonsp}(k), PN4_{nonsp}(k)$ $CP_{nonsp\_8K}(k) = PN1_{nonsp}(k),$ $CP_{nonsp\_16K}(k) = \begin{cases} PN1_{nonsp}(k) \times 2, \\ PN2_{nonsp}(k) \times 2 + \alpha_{16K} \end{cases},$ $CP_{nonsp\_32K}(k) =$ $\begin{cases} CP_{nonsp\_16K}(k) * 2 = \begin{cases} (PN1_{nonsp}(k) \times 2) \times 2 \\ (PN1_{nonsp}(k) \times 2 + \beta_{16K}) \times 2 \end{cases} \\ PN3_{nonsp}(k) * 4 + \beta 1_{32K} \\ PN4_{nonsp}(k) * 4 + \beta 2_{32K} \end{cases}$ $CP\_8K(k) = \{CP_{sp\_8K}(k), CP_{nonsp\_8K}(k)\}$ [Expression 6]
$CP\_16K(k) = \{CP_{sp\_16K}(k), CP_{nonsp\_16K}(k)\}$
$CP\_32K(k) = \{CP_{sp\_32K}(k), CP_{nonsp\_32K}(k)\}$ The above Expression s may be equations for generating CP position values to be used in each FFT mode based on the predetermined reference index table. Here, CP_8/16/32K respectively denote CP patterns in 8K, 16K and 32K FFT modes and $CP_{sp}\_8/16/32K$ respectively denote SP bearing CP patterns in 8K, 16K and 32K FFT modes. $CP_{nonsp}\_8/16/32K$ respectively represent non-SP bearing CP patterns in 8K, 16K and 32K FFT modes and $PN1_{sp}$, $PN2_{sp}$, $PN3_{sp}$ and $PN4_{sp}$ represent sequences for SP bearing pilots. These sequences may be four pseudo random sequences. These sequences may be included in an SP being set. $PN1_{nonsp}$, $PN2_{nonsp}$, $PN3_{nonsp}$ and $PN_{nonsp}$ denote sequences for non-SP bearing pilots. These sequences may be four pseudo random sequences and may be included in a non-SP bearing set. In addition, $\alpha_{16K}$, $\alpha 1_{32K}$, $\alpha 2_{32K}$, $\beta_{16K}$, $\beta 1_{32K}$ and $\beta 2_{32K}$ represent CP position offsets.

Respective SP bearing CP patterns can be generated using $PN1_{sp}$, $PN2_{sp}$, $PN3_{sp}$ and $PN4_{sp}$, as represented by Expression 4. Respective non-SP bearing patterns can be generated using $PN1_{nonsp}$, $PN2_{nonsp}$, $PN3_{nonsp}$ and $PN4_{nonsp}$, as represented by Expression 5. As represented by Expression 6, the CP pattern of each FFT mode can be composed of an SP bearing CP pattern and a non-SP bearing CP pattern. That is, an SP bearing CP index table can be added to a non-SP bearing CP index table to generate a reference index table. Consequently, CP insertion can be performed according to the non-SP bearing CP index table and the SP bearing CP index table. Here, non-SP bearing CP position values may be called a common CP set and SP bearing CP position values may be called an additional CP set.

CP position offsets may be values predetermined for multiplexing, as described above. The CP position offsets may be allocated to the same frequency irrespective of FFT mode or used to correct CP characteristics.

Figure 24:
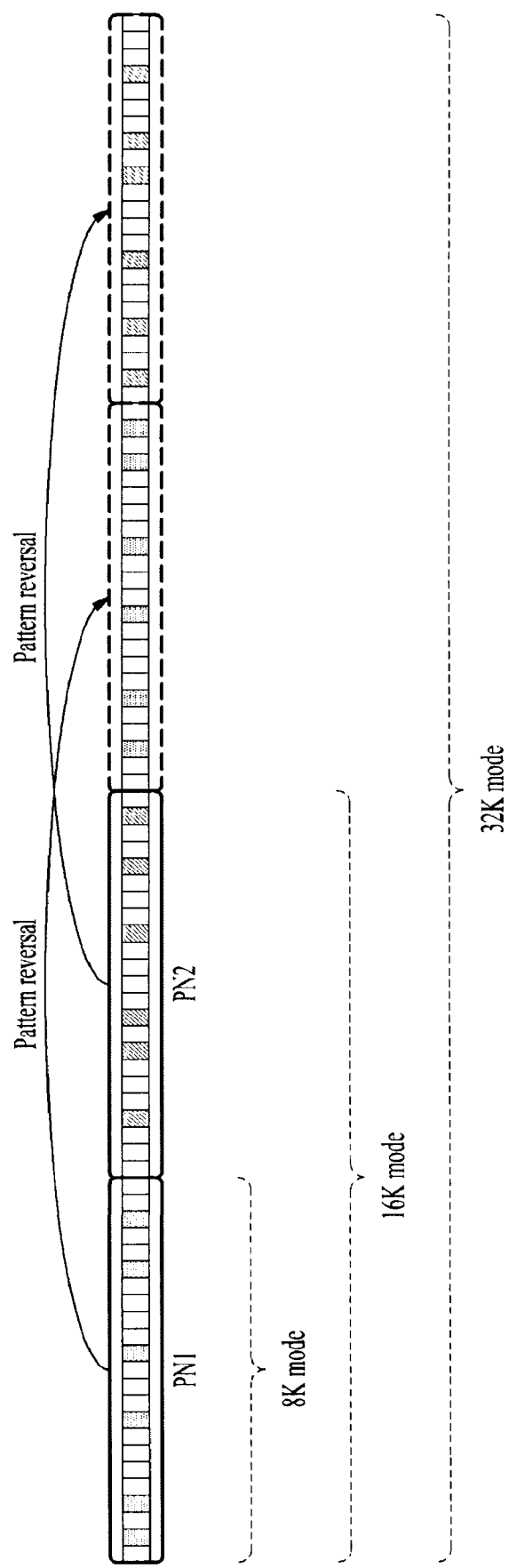
FIG. 24 illustrates the concept of configuring a reference index table in CP pattern generation method #1 using the pattern reversal method.

FIG. 24 illustrates the concept of configuring a reference index table in CP pattern generation method #1 using the pattern reversal method.

CP pattern generation method #1 using the pattern reversal method will now be described.

As described above, when the reference index table is generated, the table can be divided into sub index tables having a predetermined size. The sub index tables may include CP positions generated using different PN generators (or different seeds).

In the pattern reversal method, two sub index tables necessary in the 8K, 16K and 32K FFT modes can be generated by two different PN generators. Two sub index tables additionally necessary in the 32K FFT mode can be generated by reversing the pre-generated two sub index tables.

That is, when the 16K FFT mode is supported, CP positions according to PN1 and PN2 can be sequentially arranged to obtain a CP position distribution. When the 32K FFT mode is supported, however, CP positions according to PN1 and PN2 can be reversed to obtain a CP position distribution.

Accordingly, a CP index table in the 32K FFT mode can include a CP index table in the 16K FFT mode. In addition, the CP index table in the 16K FFT mode can include a CP index table in the 8K FFT mode. According to an embodiment, the CP index table in the 32K FFT mode may be stored and the CP index tables in the 8K and 16K FFT modes may be selected/extracted from the CP index table in the 32K FFT mode to generate the CP index tables in the 8K and 16K FFT modes.

According to the aforementioned pattern reversal method, CP positions can be distributed evenly and randomly over the spectrum. In addition, the size of a necessary reference index table can be reduced compared to the aforementioned position multiplexing method. Furthermore, memory storage capacity necessary for the receiver can be decreased.

Figure 25:
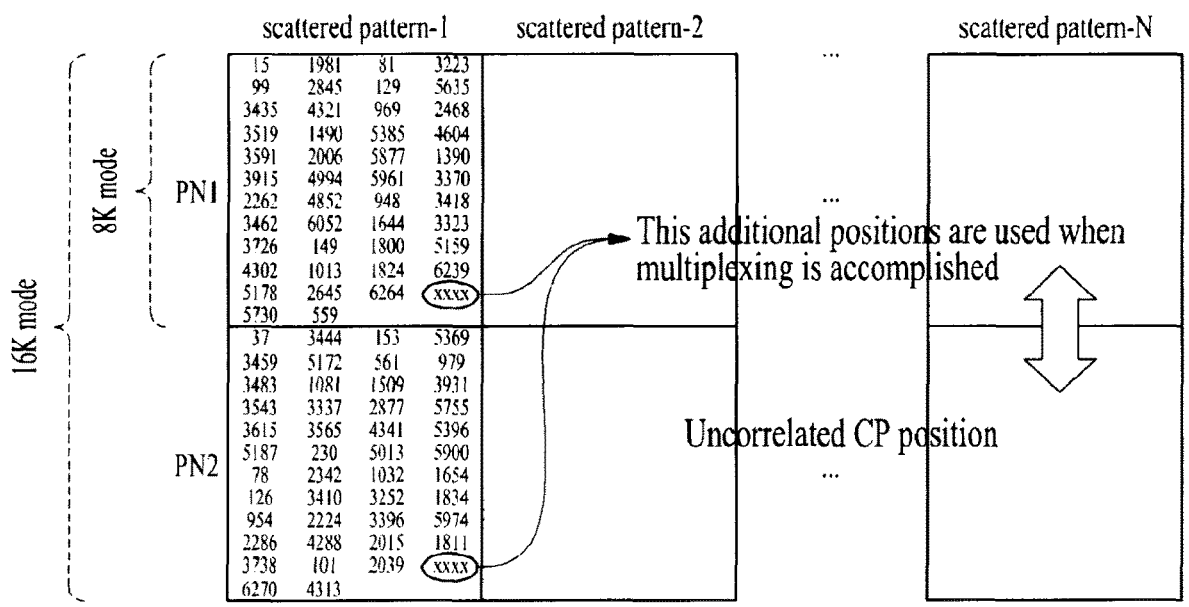
FIG. 25 illustrates a method for generating a reference index table in CP pattern generation method #1 using the pattern reversal method according to an embodiment of the present invention.

FIG. 25 illustrates a method for generating a reference index table in CP pattern generation method #1 using the pattern reversal method according to an embodiment of the present invention.

In the present embodiment, CP position information may be generated in consideration of an SP pattern with Dx=3 and Dy=4. In addition, the present embodiment may be implemented in 8K/16K/32K FFT modes (NOC: 1817/13633/27265).

CP position values may be stored in a sub index table using the 8K FFT mode as a basic mode. When 16K or higher FFT modes are supported, sub index tables may be added to the stored basic sub index table. Values of the added sub index tables may be obtained by adding a predetermined value to the stored basic sub index table or shifting the basic sub index table.

The 32K FFT mode index table can be generated using sub index tables obtained by reversing sub index tables of PN1 and PN2.

CP position values provided to the ends of sub index tables PN1 and PN2 may refer to values necessary when the corresponding sub index tables are extended. That is, the CP position values may be values for multiplexing. The CP position values provided to the ends of the sub index tables are indicated by ovals in FIG. 20.

The CP position values v provided to the ends of the sub index tables may be represented as follows.

$$v = i \cdot D_x \cdot D_y \quad \text{[Expression 7]}$$

Here, v can be represented as an integer multiple i of $D_x \cdot D_y$. When the 8K FFT mode is applied, the last position value of sub index table PN1 may not be applied. When the 16K FFT mode is applied, the last position value of sub index table PN1 is applied whereas the last position value of sub index table PN2 may not be applied.

The index table for the 32K FFT mode can be generated using the index table for the 16K FFT mode and an index table obtained by reversing the index table for the 16K FFT mode. Accordingly, the last position value of sub index table PN1 can be used twice and the last position value of sub index table PN2 can be used only once.

In the extension of a sub index table, extension according to v may be necessary or unnecessary according to embodiment. That is, there may be an embodiment of extending/reversing a sub index table without v.

In CP pattern generation method #1 using the pattern reversal method, the aforementioned multiplexing rule can be represented by the following Expression. The following Expression may be an equation for generating CP positions to be used in each FFT mode from a predetermined reference index table.

Figure 26:
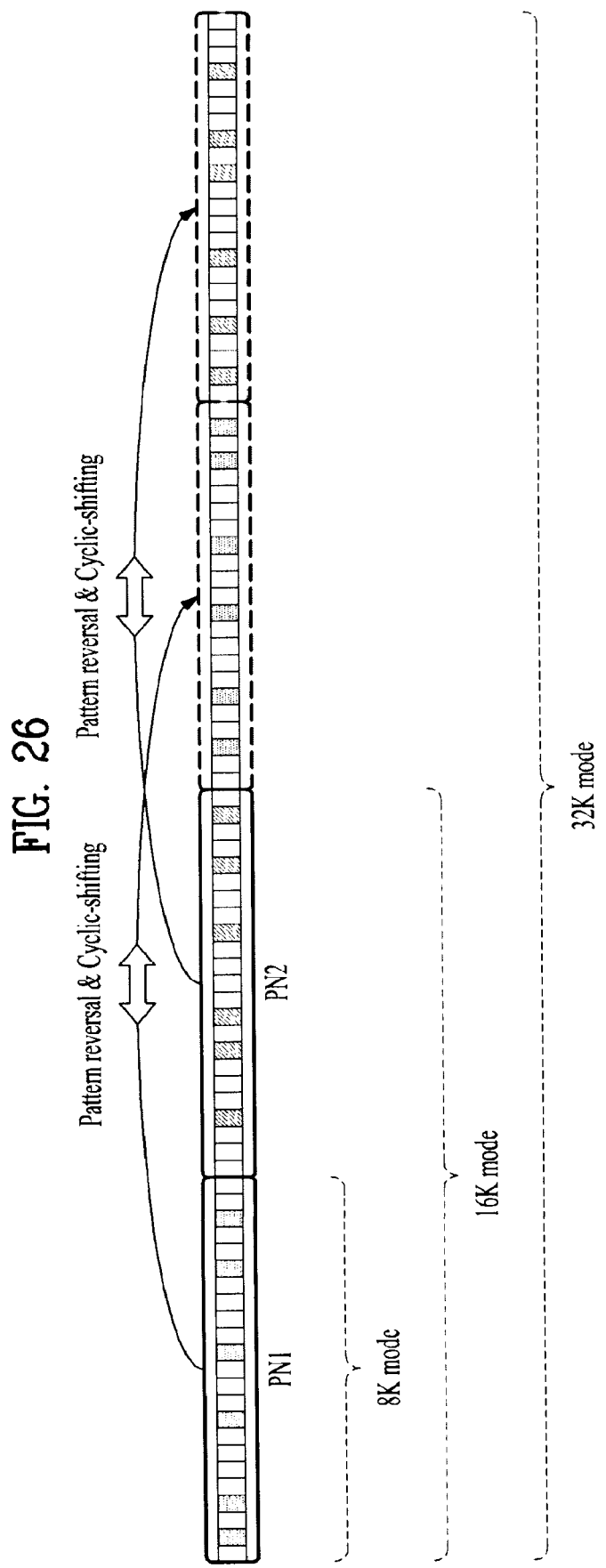
FIG. 26 illustrates the concept of configuring a reference index table in CP pattern generation method #2 using the pattern reversal method according to an embodiment of the present invention.

FIG. 26 illustrates the concept of configuring a reference index table in CP pattern generation method #2 using the pattern reversal method according to an embodiment of the present invention.

CP pattern generation method #2 using the pattern reversal method will now be described.

As described above, when the reference index table is generated, the table can be divided into sub index tables having a predetermined size. The sub index tables may include CP positions generated using different PN generators (or different seeds).

Two sub index tables necessary in the 8K, 16K and 32K FFT modes can be generated by two different PN generators, as described above. Two sub index tables additionally necessary in the 32K FFT mode can be generated by reversing the pre-generated two sub index tables. However, CP pattern generation method #2 using the pattern reversal method can generate two necessary sub index tables by cyclic-shifting patterns and then reversing the patterns rather than simply reversing the previously generated two sub index tables. Reversing operation may precede cyclic shifting operation according to embodiment. Otherwise, simple shifting instead of cyclic shifting may be performed according to embodiment.

Accordingly, a CP index table in the 32K FFT mode can include a CP index table in the 16K FFT mode. In addition,

[Expression 8]

$$CP\_8K(k) = PN1(k), \text{ for } 1 \le k \le S_{PN1} - 1$$

$$CP\_16K(k) = \begin{cases} PN1(k), & \text{if } 1 \le k \le S_{PN1} \\ \alpha_1 + PN2(k - S_{PN1}), & \text{elseif } S_{PN1} + 1 \le k \le S_{PN12} - 1 \end{cases}$$

$$CP\_32K(k) = \begin{cases} PN1(k), & \text{if } 1 \le k \le S_{PN1} \\ \alpha_1 + PN2(k - S_{PN1}), & \text{elseif } S_{PN1} + 1 \le k \le S_{PN12} - 1 \\ \alpha_2 + \boxed{(\beta - PN1(k - S_{PN12} + 1))}, & \text{elseif } S_{PN12} \le k \le S_{PN121} - 1 \\ \alpha_3 + \boxed{(\beta - PN2(k - S_{PN121} + 1))}, & \text{elseif } S_{PN121} \le k \le S_{PN1212} - 1 \end{cases}$$

where $S_{PN12} = S_{PN1} + S_{PN2}$
$S_{PN121} = 2S_{PN1} + S_{PN2}$
$S_{PN1212} = 2S_{PN1} + 2S_{PN2}$
$\beta = aD_xD_y$ A CP pattern in each FFT mode can be generated according to Expression 8. Here, symbols may be the same as the above-described ones. β denotes an integer closest to the NOA of the 8K FFT mode. That is, when the NOA is 6817, β may be 6816.

In CP_8K(k), CP_16K(k) and CP_32K(k), k may be respectively limited to $S_{PN1} - 1$, $S_{PN12} - 1$, $S_{PN121} - 1$ and $S_{PN1212} - 1$. Here, −1 is added since the last CP position value v may be excluded according to situation, as described above. In Expression 8, $$(\beta - PN1(k - S_{PN12} + 1));$$

$$(\beta - PN2(k - S_{PN121} + 1))$$

in a box represents pattern reversal.

the CP index table in the 16K FFT mode can include a CP index table in the 8K FFT mode. According to an embodiment, the CP index table in the 32K FFT mode may be stored and the CP index tables in the 8K and 16K FFT modes may be selected/extracted from the CP index table in the 32K FFT mode to generate the CP index tables in the 8K and 16K FFT modes.

As described above, when the 16K FFT mode is supported, CP position values according to PN1 and PN2 can be sequentially arranged to obtain a CP position distribution. However, according to CP pattern generation method #2 using the pattern reversal method, CP position values according to PN1 and PN2 can be cyclically shifted and then reversed to obtain a CP position distribution when the 32K FFT mode is supported.

According to CP pattern generation method #2 using the pattern reversal method, CP positions can be distributed evenly and randomly over the spectrum. In addition, the size of a necessary reference index table can be reduced compared to the aforementioned position multiplexing method. Furthermore, memory storage capacity necessary for the receiver can be decreased.

In CP pattern generation method #2 using the pattern reversal method, the aforementioned multiplexing rule can be represented by the following Expression. The following Expression may be an equation for generating CP positions to be used in each FFT mode from a predetermined reference index table.

generated by aforementioned Pattern reversal method and/or Position multiplexing method.

Values of additional CP sets can be different based on transmission methods, such as SISO or MIMO. In situation that additional robustness is needed, such as mobile reception, or for any other reasons, additional CP positions can be added to the CP set, by adding an additional CP set.

Consequently, CP insertion can be performed according to the CP set(reference index table).

[Expression 9]

$$CP\_8K(k) = PN1(k), \text{ for } 1 \leq k \leq S_{PN1} - 1$$

$$CP\_16K(k) = \begin{cases} PN1(k), \text{ if } 1 \leq k \leq S_{PN1} \\ \alpha_1 + PN2(k - S_{PN1}), \text{ elseif } S_{PN1} + 1 \leq k \leq S_{PN12} - 1 \end{cases}$$

$$CP\_32K(k) = \begin{cases} PN1(k), \text{ if } 1 \leq k \leq S_{PN1} \\ \alpha_1 + PN2(k - S_{PN1}), \text{ elseif } S_{PN1} + 1 \leq k \leq S_{PN12} - 1 \\ \boxed{\text{mod}(\gamma_1 + \alpha_2 + (\beta - PN1(k - S_{PN12} + 1)), \beta)}, \text{ elseif } S_{PN12} \leq k \leq S_{PN121} - 1 \\ \boxed{\text{mod}(\gamma_2 + \alpha_3 + (\beta - PN2(k - S_{PN121} + 1)), \beta)}, \text{ elseif } S_{PN121} \leq k \leq S_{PN1212} - 1 \end{cases}$$

where $S_{PN12} = S_{PN1} + S_{PN2}$
$S_{PN121} = 2S_{PN1} + S_{PN2}$
$S_{PN1212} = 2S_{PN1} + 2S_{PN2}$
$\beta = aD_xD_y$ A CP pattern in each FFT mode can be generated according to Expression 9. Here, symbols may be the same as the above-described ones. β denotes an integer closest to the NOA of the 8K FFT mode. That is, when the NOA is 6817, β may be 6816. $\gamma_{1/2}$ is a cyclic shift value.

In CP_8K(k), CP_16K(k) and CP_32K(k), k may be respectively limited to $S_{PN1}-1$, $S_{PN12}-1$, $S_{PN121}-1$ and $S_{PN1212}-1$. Here, −1 is added since the last CP position value v may be excluded according to situation, as described above. In Expression 9, $$\text{mod}(\gamma_1 + \alpha_2 + (\beta - PN1(k - S_{PN12} + 1)), \beta),$$

$$\text{mod}(\gamma_1 + \alpha_2 + (\beta - PN2(k - S_{PN121} + 1)), \beta),$$

in a box represents pattern reversal and cyclic shifting.

The CP pattern can be generated by a method other than aforementioned CP pattern generation methods. According to other embodiments, a CP set(CP pattern) of certain FFT size can be generated from a CP set of other FFT size, organically and dependently. In this case, a whole CP set or a part of the CP set can be base of generation process. For example, a CP set of 16K FFT mode can be generated by selecting/extracting CP positions from a CP set of 32K FFT mode. In same manner, a CP set of 8K FFT mode can be generated by selecting/extracting CP positions from a CP set of 32K FFT mode.

According to other embodiments, CP set can include SP bearing CP positions and/or non SP bearing CP positions. Non SP bearing CP positions can be referred to as common CP set. SP bearing CP positions can be referred to as additional CP set. That is, CP set can include a common CP set and/or an additional CP set. A case that only a common CP set is included in the CP set can be referred to as normal CP mode. A case that the CP set includes both a common CP set and an additional CP set can be referred to as extended CP mode.

Figure 27:
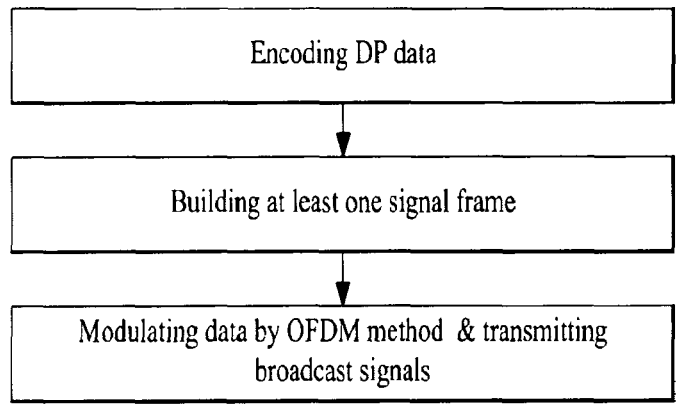
FIG. 27 illustrates a method of transmitting broadcast signal according to an embodiment of the present invention.

Values of common CP sets can be different based on FFT size. According to embodiments, the common CP set can be FIG. 27 illustrates a method of transmitting broadcast signal according to an embodiment of the present invention.

The method includes encoding DP (Data Pipe) data, building at least one signal frame, and/or modulating data by OFDM method & transmitting broadcast signals.

In step of encoding DP data, the above described coding & modulation module may encode DP data in each data path. The DP can be also referred to as Physical Layer Pipe, PLP. The step of encoding DP data can include LDPC (Low Density Parity Check) encoding, bit interleaving, mapping onto constellations, MIMO (Multi Input Multi Output) encoding, and/or time interleaving.

The step of LDPC encoding corresponds to above described LDPC encoding. The LDPC encoding can be performed on the DP data according to the code rate.

The step of bit interleaving corresponds to above-described bit interleaving by the bit interleaver. The bit interleaving can be performed on the LDPC encoded DP data.

The step of mapping onto constellations, corresponds to above-described constellation mapping by the constellation mapper. The mapping onto constellation can be performed on the bit interleaved DP data.

The step of MIMO encoding corresponds to above-described MIMO encoding by the MIMO encoder. The MIMO encoding can be performed by using a MIMO matrix. The MIMO matrix can have MIMO coefficient for power imbalance adjustment. The MIMO encoding can be performed on the mapped DP data.

The step of time interleaving corresponds to above-described time interleaving by the time interleaver. The time interleaving can be performed on the MIMO encoded DP data.

In step of building at least one signal frame, the above-described frame structure module can build signal frames by arranging (or allocating) the encoded DP data.

In step of modulating data by OFDM method & transmitting broadcast signals, the above-described waveform generation module can modulate data in OFDM method, and transmit the broadcast signals.

In this embodiment, the step of modulating can include inserting CPs (Continual Pilots) in the built signal frame. Inserting CPs can be conducted based on a CP set. The CP set can include information about locations of CPs, as described above. The CP set corresponds to aforementioned reference index table. The CP set can be defined based on FFT (Fast Fourier Transform) size.

In a method of transmitting broadcast signals according to other embodiment of the present invention, the CP set includes a common CP set and an additional CP set. The common CP set and the additional CP set are described above. Extra CP positions can be added based on encoding scheme, such as SISO, MIMO. Or in low SNR situation, extra CP positions can be added to secure high robustness.

In a method of transmitting broadcast signals according to another embodiment of the present invention, the information about locations of CPs in the common CP set defined based on 32K FFT size includes the information about locations of CPs in the common CP set defined based on 16K FFT size. The CP set of 32K FFT mode can include the CP set of 16K FFT mode. That is, the CP set of 32K FFT mode can include CP positions that can be used in the CP set of 16K FFT mode. In pattern reversal method, the CP set of 32K FFT mode can be generated by using the CP set of 16K FFT mode. Therefore, the CP set of 32K FFT mode can have information about positions of CPs that can be also included in the CP set of 16K FFT mode. In other embodiment, the CP set of 16K FFT mode can be extracted from the CP set of 32K FFT mode. Therefore, the CP set of 32K FFT mode can have information about positions of CPs that can be also included in the CP set of 16K FFT mode. This relationship can be established between a CP set of 16K FFT mode and a CP set of 8K FFT mode.

In a method of transmitting broadcast signals according to another embodiment of the present invention, the common CP set includes information about locations of non SP (Scattered Pilot) bearing CPs, and the additional CP set includes information about locations of SP bearing CPs, as described above. The common CP set can have non SP bearing CP positions, and the additional CP set can include SP bearing CP positions.

In a method of transmitting broadcast signals according to another embodiment of the present invention, the common CP set defined based on 32K FFT size includes a first sub-set, a second sub-set, a third sub-set and a fourth sub-set. The third sub-set is generated by inverting the first sub-set and shifting the inverted first sub-set. The fourth sub-set is generated by inverting the second sub-set and shifting the the inverted second sub-set. The first, second, third and fourth subset may correspond to each subset in the CP pattern generation method #2 using the pattern reversal method. By inverting and shifting a subset, other subset can be generated. CP pattern generation method #2 using the pattern reversal method is well described above.

The above-described steps can be omitted or replaced by steps executing similar or identical functions according to design.

Figure 28:
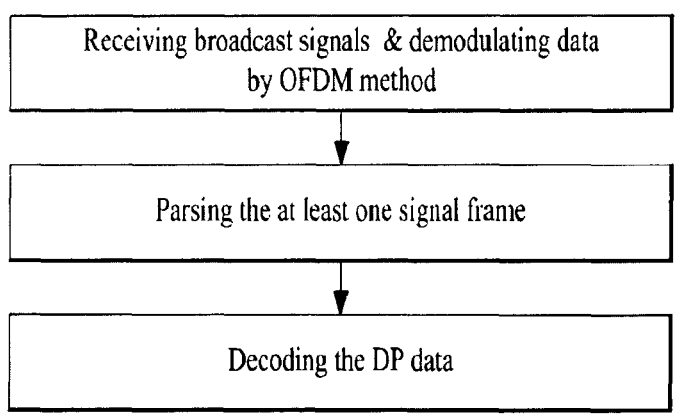
FIG. 28 illustrates a method of receiving broadcast signal according to an embodiment of the present invention.

FIG. 28 illustrates a method of receiving broadcast signal according to an embodiment of the present invention.

The method includes receiving broadcast signals & demodulating data by OFDM method, parsing the at least one signal frame, and/or decoding the DP data.

In step of receiving broadcast signals & demodulating data by OFDM method, the above-described synchronization & demodulation module receives broadcast signals, and demodulates data by OFDM method.

In step of parsing the at least one signal frame, the above-described frame parsing module parses the signal frame by demapping DP data.

In step of decoding the DP data, the above-described demapping & decoding module decodes the DP data. Step of decoding the DP data can include time deinterleaving, MIMO (Multi Input Multi Output) decoding, demapping from constellations, bit deinterleaving, and/or LDPC (Low Density Parity Check) decoding.

In step of time deinterleaving, the above-described time deinterleaver can conduct time deinterleaving DP data.

In step of MIMO decoding, the above-described MIMO decoder can conduct MIMO decoding DP data. MIMO decoding can be conducted by using MIMO matrix including MIMO coefficient. MIMO coefficient can be used for adjusting power imbalance.

In step of demapping from constellations, the above-described constellation demapper can conduct demapping. The demapping can be conducted on DP data.

In step of bit deinterleaving, the above-described bit deinterleaver can conduct bit deinterleaving.

In step of LDPC decoding. the above-described LDPC decoder (or FEC decoder) can decode DP data according to LDPC code.

In this embodiment, the step of demodulating includes step of obtaining CPs (Continual Pilots) in the signal frame. The CPs are located based on a CP set. The CP set corresponds to above-described CP set (or reference index table). The CP set can include information about locations of CPs. The CP set can include CP's positions. The CP set is defined based on FFT (Fast Fourier Transform) size.

In a method of receiving broadcast signals according to other embodiment of the present invention, the CP set includes a common CP set and an additional CP set. The common CP set and the additional CP set are described above. Extra CP positions can be added based on encoding scheme, such as SISO, MIMO. Or in low SNR situation, extra CP positions can be added to secure high robustness.

In a method of receiving broadcast signals according to another embodiment of the present invention, the information about locations of CPs in the common CP set defined based on 32K FFT size includes the information about locations of CPs in the common CP set defined based on 16K FFT size. The CP set of 32K FFT mode can include the CP set of 16K FFT mode. That is, the CP set of 32K FFT mode can include CP positions that can be used in the CP set of 16K FFT mode. In pattern reversal method, the CP set of 32K FFT mode can be generated by using the CP set of 16K FFT mode. Therefore, the CP set of 32K FFT mode can have information about positions of CPs that can be also included in the CP set of 16K FFT mode. In other embodiment, the CP set of 16K FFT mode can be extracted from the CP set of 32K FFT mode. Therefore, the CP set of 32K FFT mode can have information about positions of CPs that can be also included in the CP set of 16K FFT mode. This relationship can be established between a CP set of 16K FFT mode and a CP set of 8K FFT mode.

In a method of receiving broadcast signals according to another embodiment of the present invention, the common CP set includes information about locations of non SP (Scattered Pilot) bearing CPs, and the additional CP set includes information about locations of SP bearing CPs, as described above. The common CP set can have non SP bearing CP positions, and the additional CP set can include SP bearing CP positions.

In a method of receiving broadcast signals according to another embodiment of the present invention, the common CP set defined based on 32K FFT size includes a first sub-set, a second sub-set, a third sub-set and a fourth sub-set. The third sub-set is generated by inverting the first sub-set and shifting the inverted first sub-set. The fourth sub-set is generated by inverting the second sub-set and shifting the the inverted second sub-set. The first, second, third and fourth subset may correspond to each subset in the CP pattern generation method #2 using the pattern reversal method. By inverting and shifting a subset, other subset can be generated. CP pattern generation method #2 using the pattern reversal method is well described above.

The above-described steps can be omitted or replaced by steps executing similar or identical functions according to design.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

Various embodiments have been described in the best mode for carrying out the invention.

The present invention has industrial applicability in broadcasting and communication field.

What is claimed is:

1. A method for receiving broadcast signals by an apparatus for receiving the broadcast signals, the method comprising:
receiving the broadcast signals having at least one signal frame;
detecting Continual Pilots (CPs) for a 32K Fast Fourier Transform (FFT) size in the at least one signal frame, the CPs including a first subset and a second subset and CPs of the second subset are located where CPs of the first subset are reversed and shifted;
parsing the at least one signal frame including Data Pipe (DP) data;
time deinterleaving the DP data;
demapping the time deinterleaved DP data;
bit deinterleaving the demapped DP data; and
Low Density Parity Check (LDPC) decoding the bit deinterleaved DP data.

2. The method of claim 1,
wherein the CPs of the first subset are shifted based on a shift value.

3. An apparatus for receiving broadcast signals, the apparatus comprising:
a tuner configured to receive the broadcast signals having at least one signal frame;
a reference signal detector configured to detect Continual Pilots (CPs) for a 32K Fast Fourier Transform (FFT) size in the at least one signal frame, the CPs including a first subset and a second subset and CPs of the second subset are located where CPs of the first subset are reversed and shifted;
a parser configured to parse the at least one signal frame including Data Pipe (DP) data;
a time deinterleaver configured to time deinterleave the DP data;
a demapper configured to demap the time deinterleaved DP data;
a bit deinterleaver configured to bit deinterleave the demapped DP data; and
a Low Density Parity Check (LDPC) decoder configured to LDPC decode the bit deinterleaved DP data.

4. The apparatus of claim 3,
wherein the CPs of the first subset are shifted based on a shift value.

5. A method for receiving broadcast signals by an apparatus for receiving broadcast signals, the method comprising:
receiving the broadcast signals having at least one signal frame;
detecting Continual Pilots (CPs) for a 32K Fast Fourier Transform (FFT) size in the at least one signal frame based on locations for the CPs,
the locations for the CPs including first indices and second indices,
a sum of a location value corresponding to an i-th index of the first indices and a location value corresponding to a j-th index of the second indices is constant, and a sum of a value of i and a value of j is constant;
parsing the at least one signal frame including Data Pipe (DP) data;
time deinterleaving the DP data;
demapping the time deinterleaved DP data;
bit deinterleaving the demapped DP data; and
Low Density Parity Check (LDPC) decoding the bit deinterleaved DP data.

6. The method of claim 5,
wherein the CPs of the first indices are shifted based on a shift value.

7. An apparatus for receiving broadcast signals, the apparatus comprising:
a tuner configured to receive the broadcast signals having at least one signal frame;

a reference signal detector configured to detect Continual Pilots (CPs) for a 32K Fast Fourier Transform (FFT) size in the at least one signal frame based on locations for the CPs, the locations for the CPs including first indices and second indices, a sum of a location value corresponding to an i-th index of the first indices and a location value corresponding to a j-th index of the second indices is constant, and a sum of a value of i and a value of j is constant;

a parser configured to parse the at least one signal frame including Data Pipe (DP) data;

a time deinterleaver configured to time deinterleave the DP data;

a demapper configured to demap the time deinterleaved DP data;

a bit deinterleaver configured to bit deinterleave the demapped DP data; and a Low Density Parity Check (LDPC) decoder configured to LDPC decode the bit deinterleaved DP data.

8. The apparatus of claim 7,
wherein the CPs of the first indices are shifted based on a shift value.

* * * * *